United States Patent
Oshio et al.

(10) Patent No.: US 8,957,575 B2
(45) Date of Patent: Feb. 17, 2015

(54) RARE EARTH ALUMINUM GARNET TYPE PHOSPHOR AND LIGHT-EMITTING DEVICE USING THE SAME

(71) Applicant: Panasonic Corporation, Kadoma-shi, Osaka (JP)

(72) Inventors: Shozo Oshio, Osaka (JP); Kojiro Okuyama, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/143,961

(22) Filed: Dec. 30, 2013

(65) Prior Publication Data
US 2014/0152173 A1 Jun. 5, 2014

Related U.S. Application Data

(63) Continuation of application No. PCT/JP2012/001705, filed on Mar. 12, 2012.

(30) Foreign Application Priority Data

Jul. 5, 2011 (JP) .................................. 2011-148912
Oct. 17, 2011 (JP) .................................. 2011-228087

(51) Int. Cl.
*H01J 1/62* (2006.01)
*H01J 63/04* (2006.01)
(Continued)

(52) U.S. Cl.
CPC .......... *C09K 11/7792* (2013.01); *C09K 11/7774* (2013.01); *C09K 11/7706* (2013.01); *F21K 9/50* (2013.01); *H01L 33/502* (2013.01)
USPC ..................................... 313/503; 252/301.4 F

(58) Field of Classification Search
CPC ........... C09K 11/7774; C09K 11/7792; C09K 11/7706; F21K 9/50; H01L 33/502
USPC ............. 313/503, 502, 486, 582; 252/301.4 F, 252/301.6 F; 257/98
See application file for complete search history.

(56) References Cited

U.S. PATENT DOCUMENTS 5,998,925 A    12/1999    Shimizu et al.
6,552,487 B1    4/2003    Ellens et al.
(Continued)

FOREIGN PATENT DOCUMENTS

CN            1482208          3/2004
CN            101084329      12/2007
(Continued)

OTHER PUBLICATIONS

Chao et al., CN101760197 (english translation), Jun. 30, 2010.*
(Continued)

*Primary Examiner* — Nimeshkumar Patel
*Assistant Examiner* — Glenn Zimmerman
(74) *Attorney, Agent, or Firm* — Hamre, Schumann, Mueller & Larson, P.C.

(57) ABSTRACT

The present invention provides a new phosphor with a controllable emission wavelength without using a number of rare and expensive raw materials in forming the composition. The phosphor includes a compound including a fluorescent ion and having a garnet structure including a rare earth element, aluminum, and oxygen. The compound has such a composition that a combination of the rare earth element and the aluminum of the compound is partially replaced with a combination of alkaline earth metal and zirconium (Zr) or alkaline earth metal and hafnium (Hf).

15 Claims, 14 Drawing Sheets

(51) Int. Cl.
  *C09K 11/77* (2006.01)
  *F21K 99/00* (2010.01)
  *H01L 33/50* (2010.01)

(56) References Cited

U.S. PATENT DOCUMENTS

| | | |
|---|---|---|
| 6,669,866 B1 | 12/2003 | Kummer et al. |
| 6,812,500 B2 | 11/2004 | Reeh et al. |
| 2003/0111644 A1* | 6/2003 | Chen et al. ............ 252/301.408 |
| 2004/0062699 A1 | 4/2004 | Oshio |
| 2004/0251809 A1 | 12/2004 | Shimomura et al. |
| 2005/0242329 A1 | 11/2005 | Fiedler et al. |
| 2006/0027787 A1 | 2/2006 | Kaneyoshi |
| 2007/0187645 A1 | 8/2007 | Lyons et al. |
| 2008/0213151 A1* | 9/2008 | Yoshikawa et al. ........... 423/263 |
| 2010/0328627 A1 | 12/2010 | Miyazaki |
| 2011/0279022 A1 | 11/2011 | Winkler et al. |

FOREIGN PATENT DOCUMENTS

| | | |
|---|---|---|
| CN | 101760197 | 6/2010 |
| EP | 2085452 | 8/2009 |
| JP | 2001-192655 | 7/2001 |
| JP | 2003-505582 | 2/2003 |
| JP | 3503139 B | 3/2004 |
| JP | 2006-104049 | 4/2006 |
| JP | 2006-520836 | 9/2006 |
| JP | 2007-145705 | 6/2007 |
| JP | 2007-515527 | 6/2007 |
| JP | 2007-169647 | 7/2007 |
| JP | 4032682 B | 1/2008 |
| JP | 4263453 B | 5/2009 |
| JP | 2009-185276 | 8/2009 |
| JP | 2009-544791 | 12/2009 |
| JP | 2011-13320 | 1/2011 |
| TW | 200930802 | 7/2009 |
| WO | WO 2004/084261 | 9/2004 |
| WO | WO 2006/049284 | 5/2006 |
| WO | WO 2008/012712 | 1/2008 |
| WO | WO 2009/041297 | 4/2009 |
| WO | WO 2009041297 A1 * | 4/2009 |
| WO | WO 2010/043287 | 4/2010 |

OTHER PUBLICATIONS

EIC Search (See Printout).*
Machine Translation to English of Ishii et al. (WO2009/041297 A1) Feb. 4, 2009.*
F.S. Galasso: "Fine Ceramics no Kesso Kagaku" Third Edition; translated by Masanori Kato and Keizo Uematsu, AGNE Gijyutsu Center Inc., 1999, pp. 277-284 with partial translation.
Phosphor Research Society ed.: "Phosphor Handbook"; Ohmsha, Ltd., 1987, pp. 12, 237-238, 266-278 and 332 with partial translation (Fig. 3.3.51).
Rossner: "Trivalent Rare Earth Activated Phosphors Possibilities and Limitations"; Intertech Conference, Siemens AG Corporate Technology, Phosphor Global Summit 2003, Scottsdale, Arizona U.S.A, (4 pages).

* cited by examiner

RARE EARTH ALUMINUM GARNET TYPE PHOSPHOR AND LIGHT-EMITTING DEVICE USING THE SAME

TECHNICAL FIELD

The present invention relates to a new rare earth aluminum garnet type phosphor, which can be used broadly as a phosphor, together with, for example, light-emitting diodes (LEDs) and semiconductor laser diodes (LDs), in light sources for display devices and illumination devices such as projectors and white LED illumination light sources. The present invention also relates to a light-emitting device using this new rare earth aluminum garnet type phosphor.

BACKGROUND ART

Conventionally, compounds having a crystal structure called a "garnet structure" have been known (e.g., see Non-Patent Document 1).

The compound represented by the chemical formula $Y_3Al_3O_{12}$ is one of such compounds. $Y_3Al_5O_{12}$ is widely known as YAG, an abbreviation for yttrium aluminum garnet, and has been used in solid-state lasers, translucent ceramics, phosphors, and the like. Further, it is also known that there are compounds obtained by replacing the lattice position of Y of YAG with other metal element, particularly with a rare earth element, and compounds obtained by replacing the lattice position of Al of YAG with other metal element, particularly with Ga (e.g., see Non-Patent Document 2).

Herein, inorganic phosphor materials as compounds based on the compound represented by the chemical formula $Y_3Al_3O_{12}$ and to which ions serving as luminescent centers, for example, rare earth ions and transition metal ions typified by $Ce^{3+}$, $Tb^{3+}$, $Eu^{3+}$, $Mn^{2+}$, $Mn^{4+}$, $Fe^{3+}$, and $Cr^{3+}$, are added are defined as YAG-type phosphors (i.e., phosphors belonging to the yttrium aluminum garnet type), inorganic phosphor materials as compounds based on those obtained by replacing Y of YAG with La and to which ions serving as luminescent centers are added are defined as LaAG-type phosphors (i.e., phosphors belonging to the lanthanum aluminum garnet type), and inorganic phosphor materials as compounds based on those obtained by replacing Y of YAG with Lu and to which ions serving as luminescent centers are added are defined as LuAG-type phosphors (i.e., phosphors belonging to the lutetium aluminum garnet type). Further, these inorganic phosphor materials are defined all together as rare earth aluminum garnet type phosphors.

Further, for the sake of convenience, YAG-type phosphors activated at least with $Ce^{3+}$ are defined as YAG:Ce-type phosphors, LaAG-type phosphors activated at least with $Ce^{3+}$ are defined as LaAG:Ce-type phosphors, and LuAG-type phosphors activated at least with $Ce^{3+}$ are defined as LuAG:Ce-type phosphors. Further, these phosphors are defined all together as rare earth aluminum garnet type Ce phosphors.

That is, the term YAG-type phosphor as used herein refers to a phosphor obtained by adding an ion serving as a luminescent center to an inorganic compound having a garnet type crystal structure and including at least yttrium, aluminum and oxygen as elements constituting the crystal lattice.

Examples of such phosphors include the compounds represented by the following chemical formulas.

$(Y,Ce)_3Al_5O_{12}$ (e.g., see Patent Documents 1 and 2)
$(Y,Gd,Ce)_3Al_5O_{12}$ (e.g., see Patent Documents 1 and 2)
$(Y,Eu)_3Al_5O_{12}$ (e.g., see Patent Documents 1 and 2)
$(Y,Tb)_3(Al,Ga)_5O_{12}$ (e.g., see Non-Patent Document 2)
$(Y,Tb)_3Al_5O_{12}$ (e.g., see Non-Patent Document 2)
$(Y,Ce,Pr)_3Al_5O_{12}$ (e.g., see Patent Document 3)
$(Y,Lu,Ce,Pr)_3Al_5O_{12}$ (e.g., see Patent Document 4)
$(Y,Ce)_3(Al,Si)_5(O,N)_{12}$ (e.g., see Patent Document 5)
$(Y,Ba,Ce)_3(Al,Si)_5O_{12}$ (e.g., see Patent Document 6)

Further, LaAG-type phosphors as mentioned above are phosphors obtained by adding an ion serving as a luminescent center to an inorganic compound having a garnet type crystal structure and including at least lanthanum, aluminum, and oxygen as elements constituting the crystal lattice. Examples of LaAG-type phosphors include those mentioned above as examples of YAG-type phosphors, but Y in each of the chemical formulas is replaced with La.

Further, LuAG-type phosphors as mentioned above are phosphors obtained by adding an ion serving as a luminescent center to an inorganic compound having a garnet type crystal structure and including at least lutetium, aluminum, and oxygen as elements constituting the crystal lattice. Examples of LuAG-type phosphors include those mentioned above as examples of YAG-type phosphors, but Y in each of the chemical formulas is replaced with Lau.

Of these rare earth aluminum garnet type phosphors, YAG:Ce-type phosphors in particular are known to get excited when they are irradiated with corpuscular rays or electromagnetic waves such as electron beams, vacuum ultraviolet rays and blue light and emit yellow to green visible light. Further, it is also known that their $\frac{1}{10}$ persistence time is 100 ns or less, meaning that they have ultra-short persistence characteristics. For these reasons, YAG:Ce-type phosphors have been used broadly in many light-emitting devices (e.g., see Non-Patent Document 2, and Patent Documents 1 to 7).

For example, a $(Y,Ce)_3Al_5O_{12}$ phosphor (generally referred to as a $Y_3Al_5O_{12}:Ce^{3+}$ phosphor), whose composition is simple among the aforementioned YAG:Ce-type phosphors, emits yellow-green light. If any of the elements constituting $Y_3Al_5O_{12}Ce^{3+}$ is partially or entirely replaced with another element in the same group, for example, if Y is replaced with Lu or Gd, or Al is replaced with Ga, the color of light emitted by the phosphor changes as follows. That is, the color of light emitted by the phosphor changes to green if Al is replaced with Ga or Y is replaced with Lu, and to yellow to orange light if Y is replaced with Gd. Moreover, when an $(AlO_4)$ group constituting $Y_3Al_5O_{12}Ce^{3+}$ is partially replaced with a $(SiO_4)$ group, and Al is partially replaced with Mg to compensate for charge, the phosphor emits yellow to orange to red light (see Patent Document 8).

YAG:Ce-type phosphors, whose light colors have been controlled by partially replacing Y or Al with another element as described above, are used heavily in light-emitting devices used as light sources for display devices and for illumination devices, where primary light comes from solid-state light-emitting elements, such as light-emitting diodes (LEDs) and semiconductor laser diodes (LDs), and is emitted after being shifted toward the long wavelength side by the YAG:Ce-type phosphors (e.g., see Non-Patent Documents 2 and 3). In this way, in the realm of light-emitting devices that use green light or the like emitted by YAG-type phosphors, most notably by YAG:Ce-type phosphors, directly for illumination purposes or as a display light source, the development of new light-emitting devices is gaining momentum by partially or entirely replacing constituent elements of the crystal lattice of YAG:Ce-type phosphor with other elements with a different ion radius to control the wavelength (e.g., see Patent Documents 1, 2, and 11). For the purpose of obtaining yellow or orange emission, a composition including Gd in the crystal lattice or a composition including Mg and Si in the crystal lattice is used to control the hue.

In addition to YAG:Ce-type phosphors, several other phosphors that have a garnet structure are also known. Examples of such phosphors include a $Ca_3Sc_2Si_3O_{12}:Ce^{3+}$ (CSS for short) green phosphor (see Patent Document 9), and a $Tb_3Al_5O_{12}:Ce^{3+}$ (TAG for short) yellow-green phosphor (see Patent Document 10). These CSS and TAG may be able to replace YAG:Ce-type phosphors, and are used in the field of white LEDs or their use in the field of white LEDs has been studied.

PRIOR ART DOCUMENTS

Patent Documents

Patent Document 1: Japanese Patent No. 3503139
Patent Document 2: U.S. Pat. No. 6,812,500
Patent Document 3: JP 2001-192655 A
Patent Document 4: JP 2006-520836 A
Patent Document 5: JP 2007-515527 A
Patent Document 6: Japanese Patent No. 4263453
Patent Document 7: JP 2009-185276
Patent Document 8: WO 2010/043287
Patent Document 9: Japanese Patent No. 4032682
Patent Document 10: JP 2003-505582 A
Patent Document 11: JP 2011-13320 A Non-Patent Documents Non-Patent Document 1: F. S. Galasso, "Fine Ceramics no Kessho Kagaku", translated by Masanori Kato and Keizo Uematsu, AGNE Gijyutsu Center Inc., pp. 277 to 284
Non-Patent Document 2: Phosphor Research Society ed. "Phosphor Handbook", Ohmsha, Ltd., pp. 12, 237 to 238, 268 to 278, and 332
Non-Patent Document 3: Conference Material of Siemens AG Corporate Technology, Phosphor Global Summit 2003, Scottsdale, Ariz. USA, p. 11

DISCLOSURE OF INVENTION

Problem to be Solved by the Invention

As described above, to control the hue of light emitted by a $Ce^{3+}$-activated phosphor having a garnet structure, Ga, Sc, Lu and the like have been used conventionally as elements with which constituent elements of the crystal lattice of the YAG:Ce-type phosphor are partially or entirely replaced. However, these Ga, Lu, and Sc compounds are considered to be rare on Earth and are generally expensive. Therefore, the application of YAG-type phosphors to light-emitting devices has become difficult year after year due to the cost, while improvements in the performance of light-emitting device, such as an improvement in the hue of green display light and an improvement in color rendering of illumination light, are demanded.

Further, it is difficult to provide highly efficient phosphors having an emission peak in a wavelength range smaller than 540 nm, particularly at a wavelength less than 530 nm, and especially, it is difficult to provide highly efficient phosphors that emit blue-green light or pure green light without using rare and expensive elements as in the conventional methods that have been used to control the emission color of YAG:Ce-type phosphors.

With the foregoing in mind, it is an object of the present invention to provide a new phosphor with a controllable emission wavelength without using a number of rare and expensive raw materials in forming the composition, and to provide a light-emitting device with reduced production cost and good color rendering.

Means for Solving Problem

In order to solve the above problem, the rare earth aluminum garnet type phosphor of the present invention includes a compound including a fluorescent ion and having a garnet structure including a rare earth element, aluminum, and oxygen. The compound has such a composition that a combination of the rare earth element and the aluminum of the compound is partially replaced with a combination of alkaline earth metal and zirconium (Zr) or alkaline earth metal and hafnium (Hf).

Further, the light-emitting device of the present invention includes a phosphor and a light source for generating primary light with which the phosphor is irradiated. The rare earth aluminum garnet type phosphor of the present invention is used as the phosphor, and the primary light is wavelength converted into long wavelength light and the long wavelength light is emitted by the light-emitting device.

Effects of the Invention

According to the present invention, it is possible to provide a new phosphor that can serve especially as a phosphor that emits green light or blue-green light without using a number of rare and expensive raw materials in forming the composition.

Further, according to the present invention, it is possible to provide a light-emitting device with reduced production cost that can deliver outstanding performance in outputting green to green-blue light components.

DESCRIPTION OF THE INVENTION

Figure 1A:
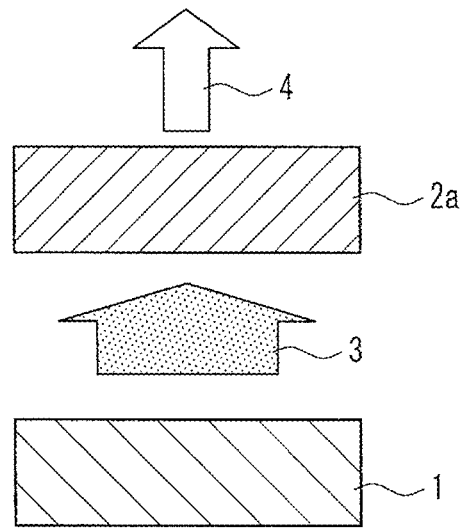
FIG. 1A and FIG. 1B are diagrams for explaining the technical ideas of a light-emitting device according to one embodiment.

The rare earth aluminum garnet type phosphor of the present invention is a compound including a fluorescent ion and having a garnet structure including a rare earth element, aluminum, and oxygen. The compound has a composition in which a combination of the rare earth element and the aluminum of the compound is partially replaced with a combination of alkaline earth metal and zirconium (Zr) or alkaline earth metal and hafnium (Hf).

As a result, it is possible to replace the constituent elements of the crystal lattice of the rare earth aluminum garnet type phosphor partially or entirely without using rare and expensive elements and to control the emission color.

In the above configuration, it is preferable that the rare earth element is yttrium, lanthanum, or lutetium, and the compound belongs to the yttrium aluminum garnet type, the lanthanum aluminum garnet type or the lutetium aluminum garnet type. As a result, it is possible to control the emission wavelength of phosphors for general purpose use, such as YAG-type phosphors, while reducing the cost.

Further, the total number of atoms of the partially replacing alkaline earth metal is greater than 0.1 and smaller than or equal to 2.0 with respect to 12 anions constituting the compound having a garnet crystal structure. As a result, it is possible to take advantage of the partial replacement to control the emission wavelength with ease.

Furthermore, it is preferable that the compound is a compound including a fluorescent ion and represented by the chemical formula $Ln_{3-x}M_xAl_{5-x}X_xO_{12}$, where Ln is a rare earth element including at least one of yttrium (Y), lanthanum (La), and lutetium (Lu), M is alkaline earth metal, X is at least one transition metal selected from zirconium (Zr) and hafnium (Hf), and x satisfies $0<x\leq2$. As a result, it is possible to obtain a rare earth aluminum garnet type phosphor that takes full advantage of the partial replacement.

Furthermore, it is preferable that the alkaline earth metal includes at least calcium (Ca). As a result of using Ca as the alkaline earth metal, it is possible to shift the emission color noticeably toward the short wavelength side.

Further, it is preferable that the compound is represented by any one of the chemical formulas $Y_{3-x}Ca_xAl_{5-x}Zr_xO_{12}$, $Y_{3-x}Ca_xAl_{5-x}Hf_xO_{12}$, $La_{3-x}Ca_xAl_{5-x}Zr_xO_{12}$, and $Lu_{3-x}Ca_xAl_{5-x}Zr_xO_{12}$, where x satisfies $0<x\leq2$. The effects resulting from the partial replacement become noticeable when a lower limit for x is greater than 0.1. A preferred upper limit to x is smaller than or equal to 2.0 in view of the cost effectiveness of the partial replacement.

Furthermore, it is preferable that the fluorescent ion includes $Ce^{3+}$. As a result, it is possible to use the rare earth aluminum garnet type phosphor of the present invention as a $Ce^{3+}$-activated green phosphor, which is used widely in light-emitting devices or whose use in light-emitting devices is studied.

Furthermore, it is preferable that the fluorescent ion further includes at least one ion selected from $Pr^{3+}$, $Tb^{3+}$ and $Mn^{2+}$, in addition to $Ce^{3+}$. As a result, it is possible to achieve a rare earth aluminum garnet type phosphor that emits light having an emission component of $Pr^{3+}$, $Tb^{3+}$ or $Mn^{2+}$, in addition to an emission component of $Ce^{3+}$ when being irradiated with near-ultraviolet to purple to blue light.

The light-emitting device of the present invention includes a phosphor and a light source for generating primary light with which the phosphor is irradiated. The rare earth aluminum garnet type phosphor according to the present invention is used as the phosphor, and the primary light is wavelength converted into long wavelength light and the long wavelength light is emitted by the light-emitting device.

As a result, it is possible to achieve a light-emitting device capable of emitting light having various wavelengths, e.g., from blue-green to red light, at low cost by using ultraviolet or blue light as primary light.

In the above configuration, it is preferable that a semiconductor solid-state light-emitting element having an emission peak in a wavelength range of 400 nm to 480 nm is used as the light source for generating primary light, and the light-emitting device emits light having an emission peak in a range of 485 nm or more, particularly 500 nm or more. As a result, it is possible to bring a light-emitting device capable of emitting light having a desired wavelength into practical use at low cost by utilizing frequently-used semiconductor light-emitting elements.

Embodiment 1

Hereinafter, embodiments of the rare earth aluminum garnet type phosphor of the present invention will be explained.

Rare earth aluminum garnet type phosphors to be explained in the present embodiment are compounds using yttrium, lanthanum, or lutetium as a rare earth element and belonging to the yttrium aluminum garnet type, the lanthanum aluminum garnet type, or the lutetium aluminum garnet type.

The rare earth aluminum garnet type phosphors according to the present embodiment are compounds that belong to the yttrium aluminum garnet type, the lanthanum aluminum garnet type, or the lutetium aluminum garnet type, and the compounds have a composition in which a combination of yttrium and aluminum, lanthanum and aluminum, or lutetium and aluminum of the compound is partially replaced with a combination of alkaline earth metal and zirconium (Zr) or alkaline earth metal and hafnium (Hf).

To explain the rare earth aluminum garnet type phosphors according to the present embodiment by focusing only on the partially replacing alkaline earth metal, the total number of atoms of the partially replacing alkaline earth metal is preferably greater than 0.1 and smaller than or equal to 2.0 with respect to 12 anions constituting each compound having a garnet crystal structure. More preferably, the total number of atoms is greater than or equal to 0.3 and smaller than 1.0, or greater than 1.0 and smaller than or equal to 2.0 with respect to 12 anions constituting each compound having a garnet crystal structure.

Further, in a more preferred aspect of a YAG-type phosphor according to the present embodiment, the compound includes a fluorescent ion and is represented by the chemical formula $Ln_{3-x}M_xAl_{5-x}X_xO_{12}$, where "Ln" is a rare earth element including at least one of Y, La, and Lu, "M" is alkaline earth metal, "X" is at least one transition metal selected from Zr and Hf, and x satisfies $0<x\leq 2$, preferably $0.3\leq x<1$ or $1<x\leq 2$.

Furthermore, it is preferable that the replacing alkaline earth metal includes at least Ca. Further, it is more preferable that the alkaline earth metal is entirely calcium. If a combination of yttrium, lanthanum, or lutetium and aluminum is partially replaced with a combination of at least alkaline earth metal, particularly, Mg, Ca or Sr, and Zr or Hf, their absolute amount declines. Therefore, it is possible to achieve a phosphor with a new composition in which at least an amount of rare earth element, i.e., yttrium, lanthanum, or lutetium, used is reduced. Further, since zirconium is utilized to form the rare earth aluminum garnet type phosphors, it is possible to achieve the phosphors as new compounds using less rare earth elements and rare metal. Consequently, it is possible to provide rare earth aluminum garnet type phosphors with new features, in particular, a rare earth aluminum garnet type Ce phosphor. Here, the effects resulting from the partial replacement become noticeable when a lower limit to x is greater than 0.1, particularly greater than or equal to 0.3. A preferred upper limit to x is smaller than or equal to 2.0 in view of the cost effectiveness of the partial replacement.

When a combination of Y and Al is partially replaced with a combination of Ca and Zr, the crystal structure becomes unstable as x is gradually increased and becomes close to 1 but it stabilizes again when x is further increased and brought close to 2. The reason for this tendency is not clear, however. Thus, when "Ln" is Y, it can be said that x is preferably in a range of $0.3\leq x<1$ or $1<x\leq 2$.

In the YAG-type phosphor according to the present embodiment, it is preferable that a YAG compound, LaAG compound, or LuAG compound including a fluorescent ion and a compound represented by the chemical formula $MZrO_3$ or $MHfO_3$ form a solid solution together, and Zr and alkaline rare earth metal M are dissolved in the YAG compound, LaAG compound, or LuAG based compound. The alkaline earth metal "M" preferably includes Ca.

Furthermore, the YAG-type phosphor according to the present embodiment is preferably a compound represented by any one of the chemical formulas $Y_{3-x}Ca_xAl_{5-x}Zr_xO_{12}$, $Y_{3-x}Ca_xAl_{5-x}Hf_xO_{12}$, $La_{3-x}Ca_xAl_{5-x}Zr_xO_{12}$ and $Lu_{3-x}Ca_xAl_{5-x}Zr_xO_{12}$, where x satisfies $0<x\leq 3$, preferably $0.1<x\leq 2$, and more preferably $0.25\leq x<1$ or $1<x\leq 2$. That is, in a more preferred aspect, the alkaline earth metal is entirely calcium.

If the alkaline earth metal includes Ca, the emission color of the rare earth aluminum garnet type Ce phosphor noticeably shifts toward the short wavelength side. This trend becomes more noticeable if the alkaline earth metal is entirely Ca. This is preferable in achieving a rare earth aluminum garnet type Ce phosphor that emits fluorescence of green with excellent color purity, blue-green or further green-blue.

Y, La or Lu of the compound represented by any one of the chemical formulas $Y_{3-x}Ca_xAl_{5-x}Zr_xO_{12}$, $Y_{3-x}Ca_xAl_{5-x}Hf_xO_{12}$, $La_{3-x}Ca_xAl_{5-x}Zr_xO_{12}$ and $Lu_{3-x}Ca_xAl_{5-x}Zr_xO_{12}$ can be partially replaced with another metallic element capable of forming a trivalent ion, particularly with a rare earth element due to chemical or physical similarities between the elements. Ca can be partially replaced with other metallic element capable of forming a bivalent ion, particularly with other alkaline earth metal. Al can be partially replaced with other metallic element capable of forming a trivalent ion, particularly with Sc as a Group 3 element or with a Group 13 element (such as Ga), or with transition metal capable of forming a trivalent ion. Zr or Hf can be partially replaced with other metallic element capable of forming a tetravalent ion, particularly with a Group 14 metallic element (in particular, Si, Ge, and/or Sn) or with a Group 4 metallic element (such as Ti).

Thus, the rare earth aluminum garnet type phosphors according to the present embodiment can be modified in a variety of ways as long as their garnet structure is not impaired and at least Y, La, or Lu and Al are included in the compositions. Specific examples of the rare earth aluminum garnet type phosphor of the present invention include the following compounds including a luminescent center ion:
$Y_{1.5}Ca_{1.5}Al_{3.5}Zr_{1.5}O_{12}$, $Y_2CaAl_4ZrO_{12}$, $Y_{2.5}Ca_{0.5}Al_{4.5}Zr_{0.5}O_{12}$, $Y_{2.7}Ca_{0.3}Al_{4.7}Zr_{0.3}O_{12}$, $Y_{2.9}Ca_{0.1}Al_{4.9}Zr_{0.1}O_{12}$, $Y_{2.97}Ca_{0.03}Al_{4.97}Zr_{0.03}O_{12}$, $Y_2CaAl_4HfO_{12}$, $Y_{2.5}Ca_{0.5}Al_{4.5}Hf_{0.5}O_{12}$, $Y_{2.5}Mg_{0.5}Al_{4.5}Zr_{0.5}O_{12}$, $Y_{2.5}Sr_{0.5}Al_{4.5}Zr_{0.5}O_{12}$, $Y_{2.5}(Ca,Mg)_{0.5}Al_{4.5}Zr_{0.5}O_{12}$, $Y_{2.5}(Ca,Sr)_{0.5}Al_{4.5}Zr_{0.5}O_{12}$, $Y_{2.5}(Ca,Ba)_{0.5}Al_{4.5}Zr_{0.5}O_{12}$, $Y_{2.5}Ca_{0.5}(Al,Ga)_{4.5}Zr_{0.5}O_{12}$, $Y_{2.5}Ca_{0.5}(Al,Sc)_{4.5}Zr_{0.5}O_{12}$, $Y_{2.5}Ca_{0.5}(Mg,Al,Si)_{4.5}Zr_{0.5}O_{12}$, $Y_{2.5}Ca_{0.5}Al_{4.5}(Zr,Si)_{0.5}O_{12}$, $Y_{2.5}Ca_{0.5}Al_{4.5}(Zr,Hf)_{0.5}O_{12}$, $(Y,Lu)_{2.5}Ca_{0.5}Al_{4.5}Zr_{0.5}O_{12}$, $La_2CaAl_4ZrO_{12}$, $(Y,La)_2CaAl_4ZrO_{12}$, $Y_2CaAl_4(Zr,Ge)O_{12}$, $Y_2CaAl_4(Zr,Sn)O_{12}$, $Y_2CaAl_3GaZrO_{12}$, $Y_2CaAl_3ScZrO_{12}$, and $Ca_2LuAl_3Zr_2O_{12}$.

The rare earth aluminum garnet type phosphors according to the present embodiment may include gallium (Ga), lutetium (Lu), scandium (Sc), and the like. In this case, it is preferable to reduce the amount of Ga, Lu, Sc, and the like to be used. However, it is more preferable that the rare earth aluminum garnet type phosphors according to the present embodiment include no artificially added Ga, Lu, or Sc. Compounds including these elements are not only rare and expensive but also it is relatively less cost-effective for them to have the function as a phosphor. Therefore, by not artificially adding Ga, Lu or Sc to the phosphors, it is possible to achieve the new rare earth aluminum garnet type phosphors with reduced production cost and using less Ga, Lu and Sc compounds.

The rare earth aluminum garnet type phosphor of the present invention in which a combination of rare earth element and aluminum is partially replaced with, for example, a combination of alkaline earth metal and zirconium, shows the following trend. When Al constituting the compound is further replaced partially with Ga or Sc, its crystal structure stabilizes.

Therefore, the rare earth aluminum garnet type phosphor of the present invention having Ga or Sc is a compound of desirable crystal quality.

Further, it is preferable that the rare earth aluminum garnet type phosphors according to the present embodiment include no Group 14 element, particularly Si. As a result, an adequately distinguishable inorganic compound from conventionally-known rare earth aluminum garnet type phosphors can be achieved.

A luminescent center ion is an ion that can emit fluorescence by electronic energy transition in a compound serving as a phosphor host material, i.e., in a crystal of a YAG compound in the present embodiment. Specifically, it is at least one ion selected from, for example, ions called $ns^2$-type luminescent centers such as $Sn^{2+}$, $Sb^{3+}$, $Tl^+$, $Pb^{2+}$, and $Bi^{3+}$, ions called transition metal luminescent centers such as $Cr^{3+}$, $Mn^{4+}$, $Mn^{2+}$, and $Fe^{3+}$, and ions called rare earth luminescent centers such as $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Sm^{2+}$, $Eu^{2+}$, and $Yb^{2+}$.

The rare earth aluminum garnet type phosphors according to the present embodiment are formed by including at least one of these luminescent center ions into any of the YAG compounds mentioned above. As a result, the YAG compound gets excited by external stimulation, for example, by irradiation with corpuscular rays (α rays, β rays, and electron beams), electromagnetic waves (γ rays, X rays, vacuum ultraviolet rays, ultraviolet rays, visible light, etc.) or the like and emit fluorescence.

As long as the fluorescence is an electromagnetic wave selected from an ultraviolet ray, visible light and an infrared ray, it is sufficient for use in light-emitting devices. However, in terms of practicality, the fluorescence is preferably visible light. If the phosphors are configured to emit visible light fluorescence, they can be used widely in light-emitting devices for display devices and illumination devices.

If at least one ion selected from $Mn^{4+}$, $Mn^{2+}$, $Ce^{3+}$, $Pr^{3+}$, $Eu^{3+}$, and $Tb^{3+}$ is used as the luminescent center ion, the phosphors can emit a visible light component with a wide range of uses, i.e., blue, blue-green, green, yellow, orange, red or white light. Especially, it is preferable to use at least one rare earth ion selected from $Ce^{3+}$, $Pr^{3+}$, $Eu^{3+}$, and $Tb^{3+}$ or the transition metal ion $Mn^{2+}$ as the luminescent center ion because the rare earth aluminum garnet type phosphors become capable of emitting blue-green light, green light, orange light, red light, or white light, which have a wider range of uses for display devices and illumination devices.

It is preferable that fluorescence emitted by the rare earth aluminum garnet type phosphors according to the present embodiment includes light emitted by $Ce^{3+}$. A preferred fluorescence ion is $Ce^{3+}$.

If $Ce^{3+}$ is used as the luminescent center ion as above, the phosphors can serve as green phosphors with the following advantages: capable of replacing $Ce^{3+}$-activated green phosphors that have been used conventionally and extensively in light-emitting devices or whose use in light-emitting devices has been studied, such as $Y_3(Al,Ga)_5O_{12}:Ce^{3+}$, $(Lu,Y)_3Al_5O^{12}:Ce^{3+}$, and $Ca_3Sc_2Si_3O_{12}:Ce^{3+}$; and capable of being produced at reduced cost with less need to use rare and expensive Ga, Lu, and Sc compounds in the production process. For these reasons, the rare earth aluminum garnet type phosphors according to the present embodiment can replace relatively expensive conventional green phosphors such as those mentioned above, thereby allowing a reduction in the production cost of light-emitting devices without compromising the properties of green light. Further, this may facilitate improvements in performance of light-emitting devices, which have been passed over previously due to an increase in the production cost associated with introduction of a $Y_3(Al,Ga)_5O_{12}:Ce^{3+}$ green phosphor and a $Ca_3Sc_2Si_3O_{12}:Ce^{3+}$ green phosphor. Consequently, it is possible to encourage the development of display devices that can output green light with an improved hue, and illumination light sources and illumination devices that can output light with improved color rendering, thereby turning these light-emitting devices to practical use.

In the rare earth aluminum garnet type Ce phosphor according to the present embodiment, the peak of the spectral distribution of light emitted by $Ce^{3+}$ resides in a wavelength range of 490 nm or more and less than 540 nm, and can reside in a wavelength range of 500 nm or more and less than 540 nm, particularly 505 nm or more and less than 535 nm.

Therefore, without using rare compounds as raw materials, it is possible to provide a phosphor capable of emitting not only green light with an excellent hue but also blue-green light or green-blue light, which has been difficult to attain only through the use of conventional raw materials for general purpose use.

On the other hand, it is known that an emission by $Ce^{3+}$ is based on an electronic energy transition from $5d^1$ to $4f^1$ as a parity allowed transition. As a result of this, a difference in energy between the light absorption and the light emission by $Ce^{3+}$ is small, and the luminescent level of $Ce^{3+}$ has a ultra-short lifespan of $10^{-8}$ to $10^{-7}$s (10 to 100 ns). In fact, the peak of the excitation spectrum of $Ce^{3+}$ resides in a shorter wavelength range than that of conventional YAG:Ce-type phosphors, specifically, in a range of more than 400 nm and less than 450 nm, particularly, more than 405 nm and less than 440 nm, and $Ce^{3+}$ has ultra-short persistence characteristics, as its $1/10$ persistent time is 1.0 msec or less.

Therefore, the rare earth aluminum garnet type Ce phosphor according to the present embodiment can serve as a phosphor with ultra-short persistence characteristics, which can emit blue-green to green light by absorbing purple to blue light as short wavelength visible light. These advantages lead to improvements in the color rendering of output light from a white LED using a blue LED and to improvements in the displayable color range of laser projectors using blue LDs and phosphors and that of liquid crystal panels using LEDs as light sources.

$Ce^{3+}$ is not the only preferred fluorescent ion for the rare earth aluminum garnet type phosphors according to the present embodiment. It is also preferable that the phosphors further include a different luminescent center ion from $Ce^{3+}$, particularly at least one ion selected from $Pr^{3+}$, $Tb^{3+}$ and $Mn^{2+}$ as a co-activator. By having such a configuration, the rare earth aluminum garnet type phosphors can emit, when being irradiated with purple to blue light, light having an emission component of $Pr^{3+}$, $Tb^{3+}$ or $Mn^{2+}$, in addition to that of $Ce^{3+}$, so that the hue of the emission color can be controlled.

As described above, the rare earth aluminum garnet type Ce phosphors according to the present embodiment can facilitate improvements in the performance of light-emitting devices using solid-state light-emitting elements such as LEDs and LDs, whose development has been particularly active in recent years. As a result, it is possible to provide light-emitting devices with improved emission properties.

Although the rare earth aluminum garnet type phosphors according to the present embodiment are new materials, they can be synthesized by solid phase reaction, a known technique used also in conventional YAG-type phosphors. That is, the rare earth aluminum garnet type phosphors according to the present embodiment can be synthesized by preparing powders of general ceramics raw materials, such as $Y_2O_3$, La$_2$O$_3$, Lu$_2$O$_3$, Sc$_2$O$_3$, CeO$_2$, Al$_2$O$_3$, Ga$_2$O$_3$, CaCO$_3$, ZrO$_2$, and HfO$_2$, to achieve a stoichiometric composition or a composition close to a stoichiometric composition, mixing the raw material powders with an automatic mortar or the like, placing the mixed raw materials in a firing container such as an alumina melting pot, and then reacting the raw materials with each other by heat in a box-type electric furnace for several hours at a firing temperature of 1,500 to 1,700° C.

Note that the forms of the rare earth aluminum garnet type phosphors according to the present embodiment as new materials are not limited. One of ordinary skill in the art can readily infer that the phosphors can be formed in a variety of forms, for example, in the form of a single crystal, a thin film, a thick film, clusters, particles, a powder, nanoparticles, ceramics, translucent ceramics, or the like and can be put to practical use in a variety of forms.

The rare earth aluminum garnet type phosphors according to the present embodiment can be mixed with, for example, a solvent such as water, an organic solvent, or resin or with water glass as appropriate to be used in the form of a slurry, a paste, a sol or a gel.

Embodiment 2

As Embodiment 2, hereinafter, a method for controlling the emission wavelength of phosphors belonging to the Ce$^{3+}$-activated rare earth aluminum garnet type will be explained.

As explained in Embodiment 1, it is possible to control the emission wavelength of a phosphor belonging to the Ce$^{3+}$-activated rare earth aluminum garnet type by partially replacing a combination of yttrium and aluminum, lanthanum and aluminum, or lutetium and aluminum of the rare earth aluminum garnet type Ce phosphor with a combination of alkaline earth metal and Zr, or alkaline earth metal and Hf.

Here, it is preferable that the alkaline earth metal includes at least Ca, and it is more preferable that the alkaline earth metal is entirely Ca. Furthermore, it is more preferable that the number of atoms of Ca and that of Zr, or the number of atoms of Ca and that of Hf are the same.

For example, a compound represented by any of the chemical formulas Y$_{3-x}$Ca$_x$Al$_{5-x}$Zr$_x$O$_{12}$, Y$_{3-x}$Ca$_x$Al$_{5-x}$Hf$_x$O$_{12}$, La$_{3-x}$Ca$_x$Al$_{5-x}$Zr$_x$O$_{12}$, and Lu$_{3-x}$Ca$_x$Al$_{5-x}$Zr$_x$O$_{12}$ is formed, and x is adjusted to satisfy 0<x≤2. As a result, as the amount of alkaline earth metal, particularly Ca, and Zr or Hf increases, i.e., as x increases, the emission peak wavelength of the rare earth aluminum garnet type Ce phosphor shifts toward the short wavelength side, i.e., from about 560 nm to 500 nm, and further to about 490 nm, so that fluorescence with a hue such as yellow-green, green, blue-green or green-blue can be achieved.

To control the fluorescence emitted by the rare earth aluminum garnet type Ce phosphors to be green light with an excellent hue, the following approach can be taken. For YAG:Ce-type phosphors belonging to the Ce$^{3+}$-activated yttrium aluminum garnet type, for example, x is adjusted to satisfy 0<x≤1. Further, for LaAG:Ce-type phosphors belonging to the Ce$^{3+}$-activated lanthanum aluminum garnet type, for example, x is adjusted to satisfy 0<x≤2. It should be noted that the preferred numerical range may vary somewhat depending on the amount of Ce$^{3+}$ added to the phosphors. In order to control YAG:Ce-type phosphors to emit green-blue or blue-green light, x is adjusted to satisfy 1<x≤2.

In the method for controlling the emission wavelength of rare earth aluminum garnet type Ce phosphors disclosed as the present embodiment, it is preferable that the phosphors do not include Ga, Lu, or Sc. As a result, it is possible to control, by the emission wavelength control method, the hue of rare earth aluminum garnet type Ce phosphors to be yellow-green, blue-green, or green-blue without using rare and expensive Ga, Lu, and Sc compounds as in conventional methods. Such an emission wavelength control method is advantageous in controlling the emission wavelength of rare earth aluminum garnet type Ce phosphors in terms of cost. Further, it is possible to adequately differentiate the present method from the emission wavelength control method explained above in the prior art section that uses rare and expensive Ga, Lu and Sc compounds, so that the present method can replace the conventional method.

In the method for controlling the emission wavelength according to the present embodiment, it is preferable that an element used to partially replace aluminum does not include a Group 14 element, particularly Si. As a result, it is possible to adequately differentiate the present control method from the conventionally-known emission wavelength control method.

Embodiment 3

As Embodiment 3, hereinafter, the light-emitting device of the present invention will be explained.

The light-emitting device according to the present embodiment includes the rare earth aluminum garnet type phosphor of the present invention explained in Embodiment 1.

It is preferable that the light-emitting device according to the present embodiment utilizes light emitted by the rare earth aluminum garnet type phosphor of the present invention for display or illumination purposes. Examples of the light-emitting device according to the present embodiment include a variety of light-emitting devices using LEDs or laser diodes and phosphors. Specific examples of such light-emitting devices include: semiconductor light-emitting devices such as white LEDs; LED illumination light sources and LED illumination devices including LED backlights such as light source devices and projectors; display devices and illumination devices such as LCDs with an LED backlight; sensors; and sensitizers.

The rare earth aluminum garnet type phosphors described in Embodiment 1 are new materials. In particular, the rare earth aluminum garnet type Ce phosphor has features missing in conventional YAG:Ce-type phosphors as explained in Embodiment 1. Thus, without using rare and expensive elements, it is possible to provide, at low cost, a light-emitting device comparable in features to those using phosphors having a garnet-type crystal structure including rare and expensive elements.

In a particularly preferred aspect, the light-emitting device includes the rare earth aluminum garnet type Ce phosphor explained in Embodiment 1. As explained in Embodiment 1, the rare earth aluminum garnet type Ce phosphor has the following advantage missing in orthodox Ce$^{3+}$-activated green phosphors such as Y$_3$(Al,Ga)$_5$O$_{12}$:Ce$^{3+}$, (Lu,Y)$_3$Al$_5$O$_{12}$:Ce$^{3+}$, and Ca$_3$Sc$_2$Si$_3$O$_{12}$:Ce$^{3+}$, which have been broadly used in conventional light-emitting devices. That is, the need to use rare metallic elements (GA, Lu, and Sc) is small. Thus, the rare earth aluminum garnet type Ce phosphor allows a reduction in the amount of rare metallic element used in Ce$^{3+}$-activated green phosphors or can replace Ce$^{3+}$-activated green phosphors. This leads to achieving a light-emitting device as a low-cost display device capable of outputting green light with an improved hue and improved persistence characteristics or a low-cost illumination light source or illumination device capable of outputting illumination light with improved color rendering.

Figure 1B:
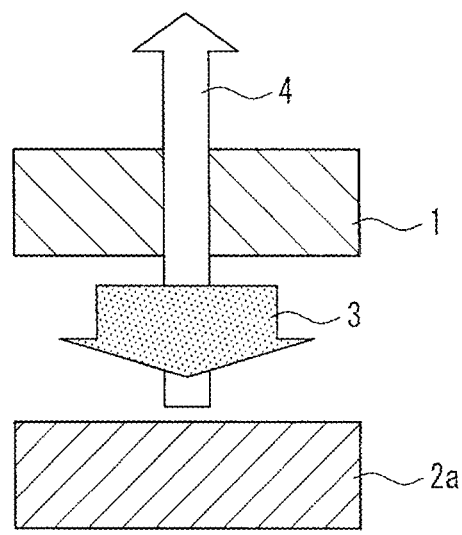

Each of FIGS. 1A and 1B is a diagram for explaining the technical ideas of the light-emitting device according to the present embodiment.

In FIGS. 1A and 1B, an excitation source 1 is a light source for generating primary light for exciting a rare earth aluminum garnet type phosphor 2a as the phosphor of the present invention explained in Embodiment 1. The excitation source 1 is a device for emitting, for example: corpuscular rays such as α rays, β rays, and electron rays; electromagnetic wave-emitting corpuscular rays such as γ rays, X-rays, vacuum ultraviolet rays, ultraviolet rays, and visible light, particularly short wavelength visible light such as purple light and blue light; or electromagnetic waves, and may be any of various radiation generating devices, electron beam emitting devices, discharge light generating devices, solid-state light-emitting elements, and solid-state light-emitting devices. Typical examples of the excitation source 1 include an electron gun, an X-ray vessel, a rare gas discharge device, a mercury discharge device, a light-emitting diode, a laser beam generating device including a semiconductor laser, and an inorganic or organic electroluminescence element.

In FIGS. 1A and 1B, output light 4 is fluorescence as output light emitted by the rare earth aluminum garnet type phosphor 2 of the present invention excited by primary light as an excitation ray or excitation light 3 emitted by the excitation source 1. The light-emitting device utilizes the output light 4 as illumination light or display light.

FIG. 1A is a conceptual diagram showing a light-emitting device configured to output the output light 4 emitted by the rare earth aluminum garnet type phosphor 2 in the same direction as the rare earth aluminum garnet type phosphor 2 being irradiated with the excitation ray or excitation light 3. Examples of light-emitting devices having the technical idea shown in FIG. 1A include white LED light sources, fluorescent lamps, and electron tubes.

On the other hand, FIG. 1B is a conceptual diagram showing a light-emitting device configured to output the output light 4 emitted by the rare earth aluminum garnet type phosphor 2 in the opposite direction to which the rare earth aluminum garnet type phosphor 2 is irradiated with the excitation ray or excitation light 3. Examples of light-emitting devices having the technical idea shown in FIG. 1B include plasma display devices, and light source devices and projectors using a phosphor wheel with a reflector.

Specifically, preferred examples of the light-emitting device according to the present embodiment include a semiconductor light-emitting device, an illumination light source, an illumination device, a liquid crystal panel with an LED backlight, an LED projector, and a laser projector including a rare earth aluminum garnet type phosphor. Hereinafter, the light-emitting device according to the present embodiment will be explained in detail by taking a semiconductor light-emitting device and a projector light source as specific examples thereof.

(Semiconductor Light-Emitting Device)

Figure 2:
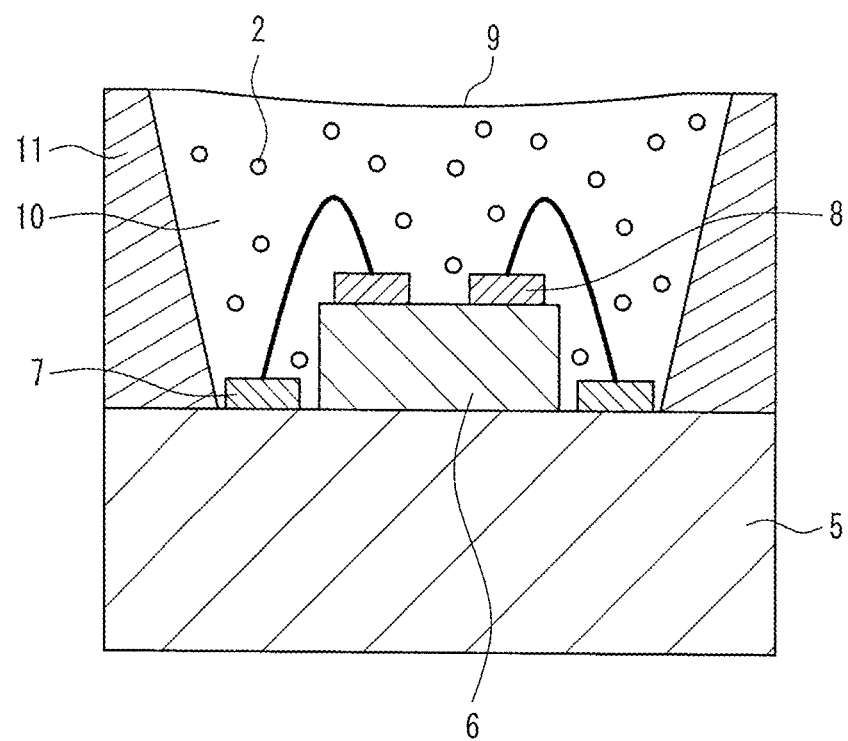
FIG. 2 is a schematic cross-sectional view showing an exemplary semiconductor light-emitting device according to one embodiment.

FIG. 2 is a schematic cross-sectional view showing a semiconductor light-emitting device as a first specific example of the light source device according to the present embodiment. Although FIG. 2 is a cross-sectional view, a translucent resin 10 is not hatched in order to facilitate the understanding of the drawing.

In FIG. 2, a substrate 5 serves as a base to which a solid-state light-emitting element 6 is fixed. For example, the substrate 5 is made of any of the following: ceramics such as $Al_2O_3$ and AlN, metal such as Al and Cu, glass, and resins such as a silicone resin and a filler-containing silicone resin.

Further, wiring conductors 7 are provided on the substrate 5. Power is supplied to the solid-state light-emitting element 6 by electrically connecting feeding electrodes 8 of the solid-state light-emitting element 6 to the wiring conductors 7 through a gold wire or the like.

The solid-state light-emitting element 6 as a light source for generating primary light is an electro-optic conversion element that receives power by application of at least one voltage selected from direct current, alternating current, and pulse, and converts electrical energy into optical energy such as near ultraviolet rays, purple light or blue light. Examples of the solid-state light-emitting element 6 include an LED, an LD, an inorganic electroluminescence (EL) element, and an organic EL element. For the purpose of obtaining high-power primary light having a narrow spectrum half band, the solid-state light-emitting element 6 is preferably an LED or an LD. In the configuration shown in FIG. 2, the solid-state light-emitting element 6 is an LED having a light-emitting layer of an InGaN compound.

A wavelength conversion layer 9 includes a phosphor 2 made of a fluorescent material, and converts primary light emitted by the solid-state light-emitting element 6 into light whose wavelength is shifted relatively toward the long wavelength side. The wavelength conversion layer 9 is composed of the translucent resin 10 containing, as the phosphor 2, the rare earth aluminum garnet type phosphor of the present invention explained in Embodiment 1. The wavelength conversion layer 9 of the semiconductor light-emitting device according to the present embodiment can be formed by including the phosphor in a resin fluorescent film, translucent fluorescent ceramics, fluorescent glass, or the like.

Although the rare earth aluminum garnet type Ce phosphor of the present invention explained in Embodiment 1 can be used alone in the wavelength conversion layer 9 as the phosphor 2, a different phosphor from the rare earth aluminum garnet type Ce phosphor may also be contained as needed. Further, two or more types of the rare earth aluminum garnet type phosphors according to Embodiment 1 different in composition or emission color may be used in combination.

Phosphors different from the rare earth aluminum garnet type Ce phosphor and usable in the wavelength convention layer 9 are not particularly limited as long as they absorb primary light emitted by the solid-state light-emitting element 6 and convert the primary light into light whose wavelength is shifted relatively toward the long wavelength side. By choosing such phosphors from a variety of phosphors that emit blue light, green-blue light, blue-green light, green light, yellow light, orange light and red light as appropriate for the semiconductor light-emitting device, the semiconductor light-emitting device can emit output light with a desired color.

When the semiconductor light-emitting device uses an LED or LD as the solid-state light-emitting element 6, high-efficiency phosphors preferable for the semiconductor light-emitting device are oxide phosphors made from oxides, acid halides and the like, nitride phosphors made from nitrides, oxynitrides and the like, and sulfide phosphors made from sulfides, oxysulfides and the like, all of which are activated at least with $Eu^{2+}$ or $Ce^{3+}$.

More specifically, examples of blue phosphors include $BaMgAl_{10}O_{17}:Eu^{2+}$, $CaMgSi_2O_6:Eu^{2+}$, $Ba_3MgSi_2O_8:Eu^{2+}$, and $Sr_{10}(PO_4)_6Cl_2:Eu^{2+}$, examples of green-blue or blue-green phosphors include $Sr_4Si_3O_8Cl_4:Eu^{2+}$, $Sr_4Al_{14}O_{24}Eu^{2+}$, $BaAl_8O_{13}:Eu^{2+}$, $Ba_2SiO_4:Eu^{2+}$, and $BaZrSi_3O_9:Eu^{2+}$, examples of green phosphors include $(Ba,Sr)_2SiO_4:Eu^{2+}$, $BaMgAl_{10}O_{17}:Eu^{2+}$, $Mn^{2+}$, $CeMgAl_{11}O_{19}:Mn^{2+}$, $Y_3Al_5O_{12}Ce^{3+}$, $Ca_3Sc_2Si_3O_{12}Ce^{3+}$, $CaSc_2O_4:Ce^{3+}$, β-$Si_3N_4$:$Eu^{2+}$, $SrSi_2O_2N_2$:$Eu^{2+}$, $Ba_3Si_6O_{12}N_2$:$Eu^{2+}$, $Sr_3Si_{13}Al_3O_2N_{21}$:$Eu^{2+}$, $YTbSi_4N_6C$:$Ce^{3+}$, and $SrGa_2S_4$:$Eu^{2+}$, examples of yellow or orange phosphors include (Sr, Ba)$_2SiO_4$:$Eu^{2+}$, (Y,Gd)$_3Al_5O_{12}$:$Ce^{3+}$, α-Ca—SiAlON:$Eu^{2+}$, $Y_2Si_4N_6C$:$Ce^{3+}$, and $Y_3MgAl(AlO_4)_2(SiO_4)$:$Ce^{3+}$, and examples of red phosphors include $Sr_2Si_5N_8$:$Eu^{2+}$, $CaAlSiN_3$:$Eu^{2+}$, $SrAlSi_4N_7$:$Eu^{2+}$, CaS:$Eu^{2+}$, $La_2O_2S$:$Eu^{3+}$, and $Y_3Mg_2(AlO_4)(SiO_4)_2$:$Ce^{3+}$.

If the phosphors used are all oxide phosphors, the semiconductor light-emitting device can be achieved at low cost.

For most of the rare earth aluminum garnet type phosphors explained in Embodiment 1, the peak of the excitation spectrum resides in a wavelength range of 400 nm or more and less than 480 nm. Thus, the light-emitting device according to the present embodiment includes the solid-state light-emitting element 6 that emits purple or blue light having an emission peak in a wavelength range of 400 nm or more and less than 480 nm and the wavelength conversion layer 9 at least including the rare earth aluminum garnet type Ce phosphor 2 that emits green light having an emission peak in a wavelength range of 485 nm or more and less than 540 nm, particularly 500 nm or more and less than 540 nm.

A preferred combination of a solid-state light-emitting element and a phosphor(s) is as follows. For a purple solid-state light-emitting element, a combination of blue, green and red phosphors, or a combination of blue-green, yellow and red phosphors is preferable. For a blue solid-state light-emitting element, a combination of green and yellow phosphors, or a combination of green and red phosphors, or simply a green phosphor is preferable. It is preferable to use any of these combinations to configure the semiconductor light-emitting device or to configure the semiconductor light-emitting device to emit, in the end, output light based on any of these combinations.

The semiconductor light-emitting device according to the present embodiment uses the rare earth aluminum garnet type Ce phosphor explained in Embodiment 1 as a green, blue-green or green-blue phosphor mentioned above.

Here, an exemplary method of producing the semiconductor light-emitting device according to the present embodiment will be explained.

First, through the use of a mounting technique, the solid-state light-emitting element 6 is fixed onto the substrate 5 provided with the wiring conductors 7. Then, the feeding electrodes 8 of the solid-state light-emitting element 6 and the wiring conductors 7 are connected electrically through the use of a wire-bonding technique or the like. Meanwhile, the translucent resin 10, such as a silicone resin, is mixed with the phosphor 2 adequately to prepare a phosphor paste adjusted to have a predetermined viscosity. The weight percentage of the phosphor 2 in the phosphor paste is adjusted to be about several percent to several tens of percent. Subsequently, for example, the phosphor paste is dropped onto the solid-state light-emitting element 6 to cover the light-extraction surface of the solid-state light-emitting element 6 with the phosphor paste, followed by solidifying the phosphor paste by drying to form the wavelength conversion layer 9, thus obtaining the semiconductor light-emitting device.

In the semiconductor light-emitting device produced in this way, when predetermined power is supplied the solid-state light-emitting element 6, the solid-state light-emitting element 6 is energized, and emits primary light as blue light having an emission peak in a wavelength range of 440 nm or more and less than 480 nm. This primary light is wavelength converted into blue-green or green light by the rare earth aluminum garnet type Ce phosphor with a high degree of wavelength-conversion efficiency.

The phosphor 2 contained in the wavelength conversion layer 9 is irradiated with the primary light, and the phosphor 2 absorbs a part of the primary light. The absorbed primary light is wavelength converted by the phosphor 2 into light whose wavelength is shifted relatively toward the long wavelength side (low energy side). And the light wavelength converted by the phosphor 2 passes through the translucent resin 10, and exits from the semiconductor light-emitting device. Meanwhile, the primary light unabsorbed by the phosphor 2 also passes through the translucent resin 10 and exists from the semiconductor light-emitting device. As a result, both the wavelength converted light by the phosphor 2 and the primary light unabsorbed by the phosphor 2 exit from the semiconductor light-emitting device, and light components resulting from mixture and addition of these lights are outputted from the semiconductor light-emitting device. The thickness and the light transmittance of the wavelength conversion layer 9, the type of the phosphor 2, the mixing ratio of the phosphor 2 in the wavelength conversion layer 9, and the wavelength of the primary light emitted by the solid-state light-emitting element can be adjusted as appropriate. Therefore, the light source may be designed to have a desired light source color or to obtain illumination light such as white illumination light. In some cases, the phosphor may absorb the primary light completely and wavelength convert the entire primary light. In this case, the only output light from the semiconductor light-emitting device is light wavelength converted by the phosphor.

In the above example, the primary light from the solid-state light-emitting element 6 is blue light having an emission peak in a wavelength range of 440 nm or more and less than 480 nm, and is wavelength converted into blue-green or green light by the rare earth aluminum garnet type Ce phosphor. If the rare earth aluminum garnet type Ce phosphor 2 is a green phosphor having an excitation peak on the shorter wavelength side than the blue region, i.e., in a wavelength range of 440 nm or more and less than 500 nm, the light-emitting device may be configured such that the primary light from the solid-state light-emitting element 6 is blue light. It is generally known that $Ce^{3+}$-activated phosphors can wavelength convert, with a high degree of photon conversion efficiency (internal quantum efficiency), light having an excitation peak on the longest wavelength side into light whose wavelength is longer than the absorbed light. Also by this way, it is possible to provide a semiconductor light-emitting device that emits an improved ray bundle.

Figure 3:
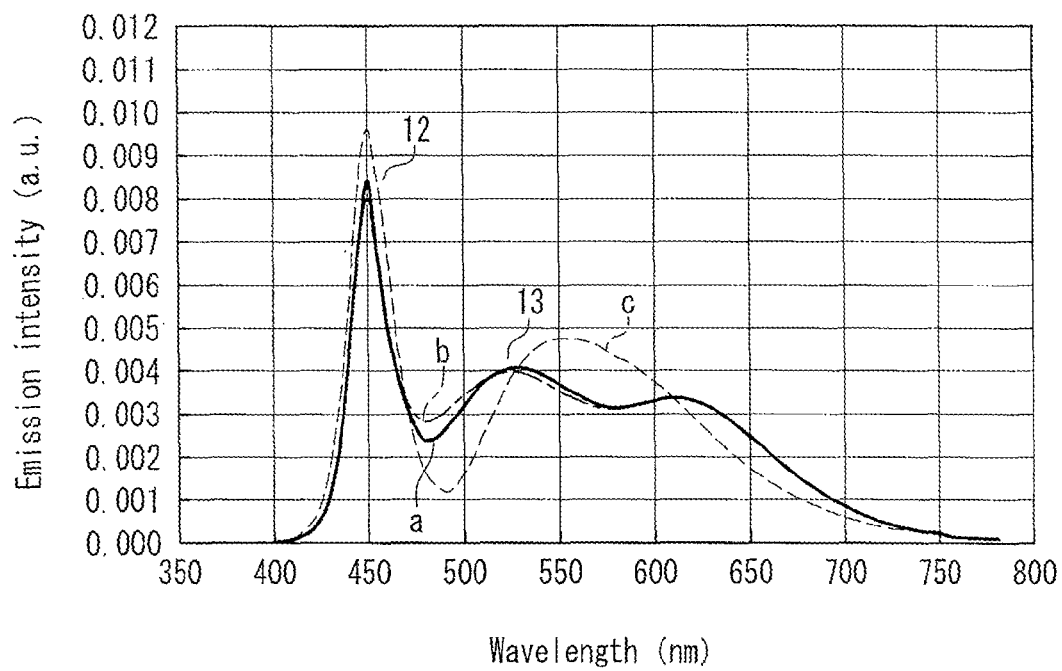
FIG. 3 is a graph showing a spectral distribution of output light emitted by a first semiconductor light-emitting device according to one embodiment.
Figure 4:
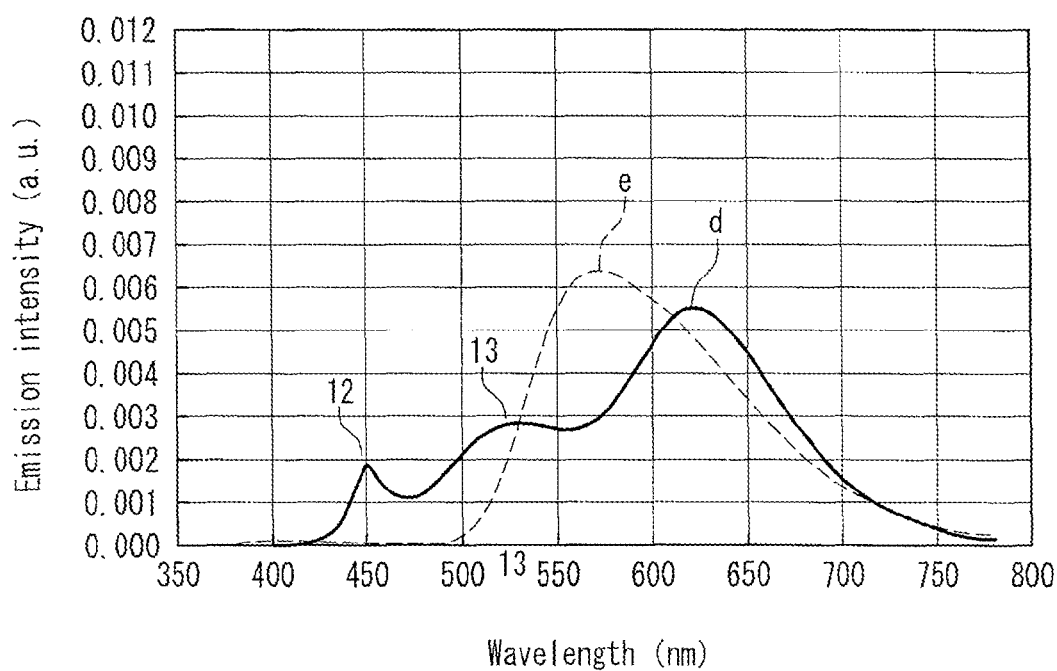
FIG. 4 is a graph showing a spectral distribution of output light emitted by a second semiconductor light-emitting device according to one embodiment.
Figure 5:
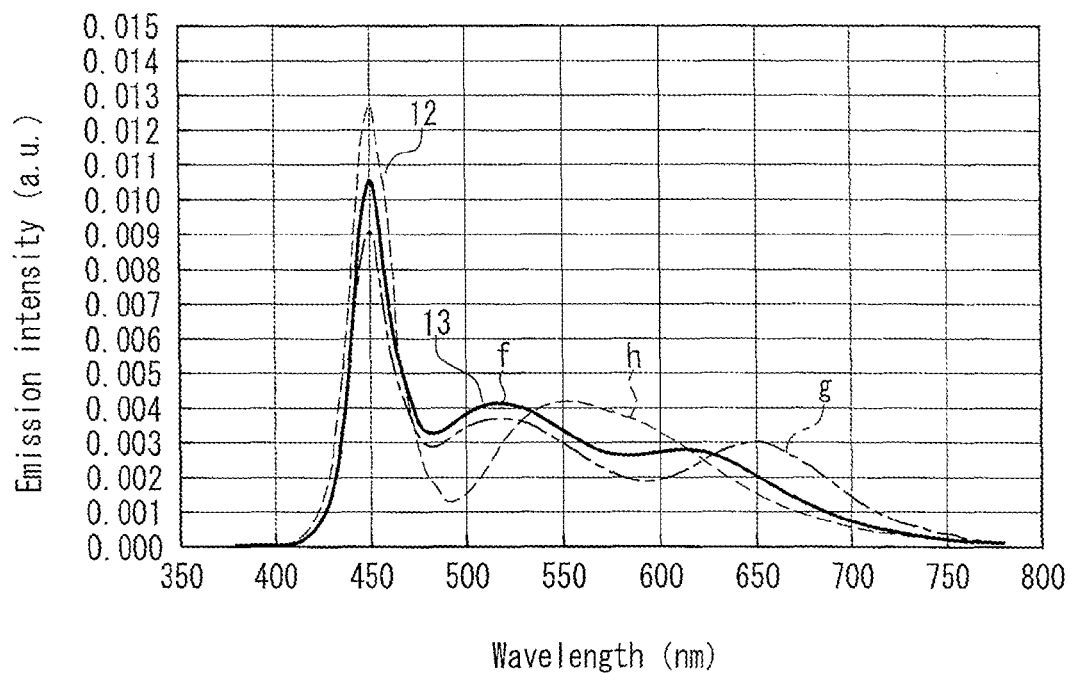
FIG. 5 is a graph showing a spectral distribution of output light emitted by a third semiconductor light-emitting device according to one embodiment.

Each of FIGS. 3 to 5 shows a spectral distribution of output light emitted by the semiconductor light-emitting device according to the present embodiment.

As described above, the semiconductor light-emitting device according to the present embodiment outputs at least a purple or blue light component having an emission peak in a wavelength range of 400 nm or more and less than 480 nm and a blue-green or green light component having an emission peak in a wavelength range of 485 nm or more and less than 540 nm, particularly 500 nm or more and less than 540 nm. Therefore, FIGS. 3 to 5 each show a blue light component 12 having an emission peak in a wavelength range of 440 nm or more and less than 480 nm and a blue-green or green light component 13 having an emission peak in a wavelength range of 500 nm or more and less 540 nm outputted by the semiconductor light-emitting device as a specific example.

An InGaN blue LED as a solid-state light emitting element having a light-emitting layer of a blue light-emitting InGaN compound, the rare earth aluminum garnet type Ce phosphor described in Embodiment 1, and a red phosphor are at least used to simulate tri-color white output light having a correlated color temperature of 6700 k, equivalent to daylight. FIG. 3 shows a spectral distribution of the output light.

A solid line a shown in FIG. 3 indicates a spectral distribution of output light obtained by using in combination the InGaN blue LED, the YAG:Ce-type phosphor according to Embodiment 1 that emits a green light component having an emission peak around 530 nm, and an $Eu^{2+}$-activated phosphor that emits a red light component having an emission peak around 620 nm. Further, an alternate long and short dash line b shown in FIG. 3 indicates a spectral distribution of output light obtained by using in combination the InGaN blue LED, the YAG:Ce-type phosphor according to Embodiment 1 that emits a blue-green light component having an emission peak around 515 nm, a conventional YAG:Ce-type phosphor that emits a yellow-green light component having an emission peak around 555 nm, and an $Eu^{2+}$-activated phosphor that emits a red light component having an emission peak around 620 nm.

As a reference example, an InGaN blue LED and a conventional YAG:Ce-type phosphor that emits a yellow-green color component having an emission peak around 555 nm are used to simulate pseudo white output light having a correlated color temperature of 6700 k. A dotted line c shown in FIG. 3 indicates a spectral distribution of this output light.

The white output light indicated by the solid line a in FIG. 3 has an average color rendering index Ra of 95.5, which is sufficiently higher than the Ra (=77.0) of the pseudo white light indicated by the dotted line c in FIG. 3 as a comparative example. Thus, the white output light can be used as illumination light close to natural light. Further, the white output light indicated by the alternate long and short dash line b in FIG. 3 has an average color rendering index Ra of 97.1, so that it can be used roughly as natural light.

An InGaN blue LED as a solid-state light emitting element having a light-emitting layer of a blue light-emitting InGaN compound, the YAG:Ce-type phosphor described in Embodiment 1, and a red phosphor are used to simulate tri-color white output light having a correlated color temperature of 2800 k, equivalent to electric bulb color. FIG. 4 shows a spectral distribution of the output light.

A solid line d in FIG. 4 indicates a spectral distribution of output light obtained by using in combination the InGaN blue LED, the YAG:Ce-type phosphor that emits a green light component having an emission peak around 530 nm, and an $Eu^{2+}$-activated phosphor that emits a red light component having an emission peak around 620 nm.

For a reference purpose, an InGaN blue LED and a conventional YAG:Ce-type phosphor that emits a yellow light component having an emission peak around 575 nm are used to simulate pseudo white output light having a correlated color temperature of 2800 k. A dotted line e in FIG. 4 indicates a spectral distribution of this output light.

The white output light indicated by the solid line d in FIG. 4 has an average color rendering index Ra of 93.1, which is sufficiently higher than the Ra (=54.5) of the pseudo white light indicated by the dotted line e in FIG. 4 as a comparative example. Thus, the white output light can be used as illumination light close to natural light.

An InGaN blue LED as a solid-state light-emitting element having an emission peak around 450 nm and a light-emitting layer of a InGaN compound, a YAG:Ce-type phosphor having an emission peak around 520 nm, and a red phosphor having an emission peak around 620 nm or around 650 nm are used to simulate tri-color white output light having a correlated color temperature of 1200 k. FIG. 5 shows a spectral distribution of the output light.

A solid line f in FIG. 5 indicates a spectral distribution of output light obtained by using an $Eu^{2+}$-activated phosphor that emits a red light component having an emission peak around 620 nm. An alternate long and short dash line g in FIG. 5 indicates a spectral distribution of output light obtained by using $CaAlSiN_3:Eu^{2+}$ having an emission peak around 650 nm.

For a reference purpose, an InGaN blue LED and a conventional YAG:Ce-type phosphor that emits a yellow-green light component having an emission peak around 555 nm are used to simulate pseudo white output light having a correlated color temperature of 12000 k. A dotted line h in FIG. 5 indicates a spectral distribution of this output light.

The white output light of the semiconductor light source device according to the present embodiment indicated by the solid line f in FIG. 5 is of a tri-color type having peaks around 450 nm, 520 nm and 620 nm, unlike the pseudo white light whose spectral distribution is indicated by the dotted line h in FIG. 5. Thus, by utilizing intense red, green and blue light components, the output light can be used as a light source for a multicolor display with an improved optical output and a wide color range. Further, the white output light indicated by the alternate long and short dash line g in FIG. 5 has peaks around 450 nm, 520 nm and 650 nm, so that it can be used as a light source for a multicolor display with a wider color range.

For the $Eu^{2+}$-activated phosphor that emits a red light component having an emission peak around 620 nm and is used in the semiconductor light source devices whose spectral distributions are shown in FIGS. 3 to 5, for example, $Eu^{2+}$-activated nitrido aluminosilicate phosphors (such as $(Sr, Ca)AlSiN_3:Eu^{2+}$, and $SrAlSi_4N_7:Eu^{2+}$) can be used.

Figure 6:
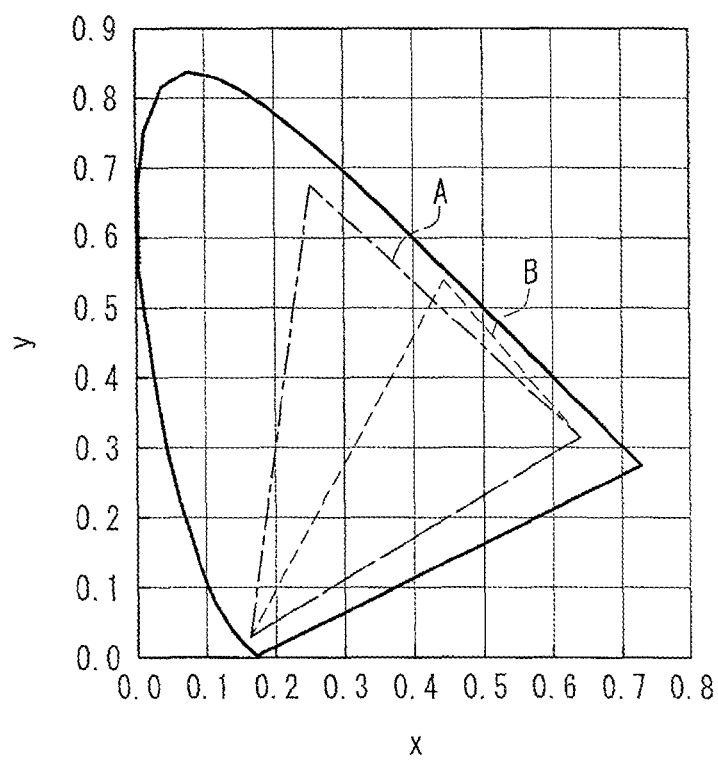
FIG. 6 is a chromaticity diagram showing a displayable color range of a display device according to one embodiment.

FIG. 6 is a CIE chromaticity diagram showing an overview of displayable color ranges of display devices using the semiconductor light-emitting devices whose exemplary spectral distributions are indicated by the solid line f and dotted line h in FIG. 5, respectively. In FIG. 6, A indicates a displayable color range of a display device using the semiconductor light-emitting device that emits the tri-color output light indicted by the solid line f in FIG. 5. Further, in FIG. 6, B indicates a displayable color range of a display device using the semiconductor light-emitting device that emits the pseudo white output light indicted by the dotted line h in FIG. 5. As shown in FIG. 5, in comparison with the pseudo white color, the red and green light components of the white output light have relatively higher intensity than that of the blue light component due to the white light being of a tri-color type. Thus, high-intensity display can be performed even in a wide color range indicated by A in FIG. 6. The present invention can provide a display device capable of attaining high-intensity display in such a wide color range while using as little rare metallic elements as possible.

As explained above, by using in combination a solid-state light-emitting element that emits purple or blue light and the rare earth aluminum garnet type Ce phosphor that absorbs purple or blue light and emits a blue-green light component or a green light component with an excellent hue, the semiconductor light-emitting device as the first specific example of the present embodiment can emit at least a green-blue or blue-green light component or a green light component with an excellent hue having an emission peak in a wavelength range of 485 nm or more and less than 540 nm, particularly 500 nm or more and less than 540 nm. The green-blue or blue-green light component can bring the spectral distribution of light emitted by the illumination light source closer to that of natural light, so that the color rendering of illumination light can be improved. Further, the excellent green light component can increase the color range of the display device in terms of hue.

Unlike conventional high-efficiency green phosphors excitable by purple to blue light, the rare earth aluminum garnet type Ce phosphor used in the semiconductor light source device of the present embodiment requires no rare and expensive element, thereby reducing the cost significantly. Therefore, the semiconductor light-emitting device according to the present embodiment has no factor that leads to a cost increase in improving the color rendering of illumination light or increasing the color range of the display device, so that a semiconductor light-emitting device with improved characteristics easily can be put into commercial production. Further, it is possible to encourage putting semiconductor light-emitting devices into practical use, which has been passed over conventionally due to cost increase.

Although not being illustrated specifically, the semiconductor light-emitting device according to the present embodiment can be used in a wide variety of applications such as a backlight for an illumination light source or for a liquid crystal display and a light source for a display device. Even when the semiconductor light-emitting device according to the present embodiment is used as a light-emitting device for an illumination light source or the like, it still has the same advantage as that of the semiconductor light-emitting device according to the present embodiment, i.e., capable of providing an illumination light source with enhanced color rendering and a display device with a wide displayable color range by using the rare earth aluminum garnet type phosphor that requires no rare and expensive elements.

That is, the semiconductor light-emitting device according to the present embodiment covers a wide range of light-emitting devices such as illumination light sources and display devices. For example, an illumination light source can be adequately configured by at least combining at least one semiconductor light-emitting device according to the present embodiment, a lighting circuit for operating the semiconductor light-emitting device, and a component, such as a connector, for connecting the illumination light source and a lighting fixture electrically. If the illumination light source is further combined with a lighting fixture as needed, an illumination device or illumination system can be configured.

Further, a display device using the semiconductor light-emitting device according to the present embodiment can be configured adequately by at least combining the semiconductor light-emitting devices according to the present embodiment arranged in a matrix, and a signal circuit for turning on and off the semiconductor light-emitting devices arranged in a matrix. In another aspect, the display device including the semiconductor light-emitting devices according to the present embodiment is, for example, a liquid crystal panel with an LED backlight function. In this display device, the semiconductor light-emitting devices according to the present embodiment are arranged in lines or in a matrix and are used as backlights. And such a display device can be configured adequately by at least combining the backlights, a lighting circuit for lighting the backlights or a control circuit for turning on and off the backlights, and a liquid crystal panel.

(Light Source Device)

Figure 7:
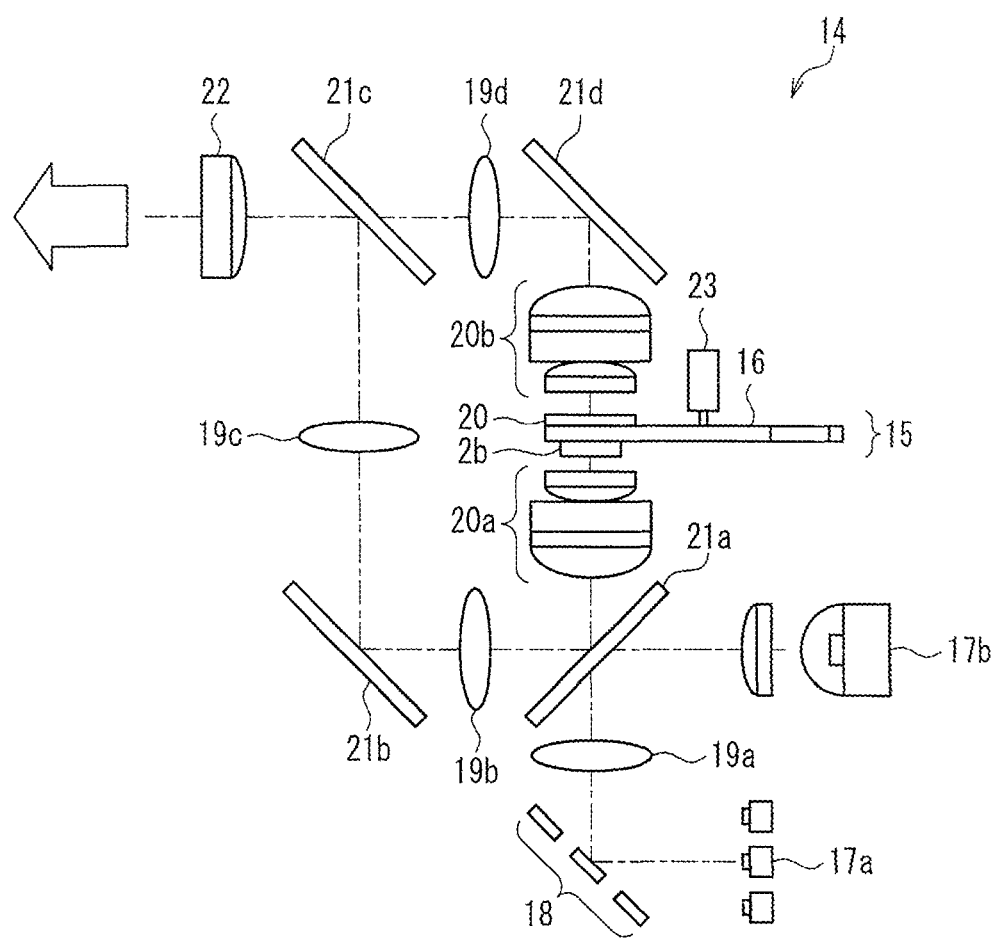
FIG. 7 is a diagram showing a configuration of an exemplary light source device according to one embodiment.

FIG. 7 is a diagram showing a light source device 14 as a second specific example of the light-emitting device according to the present embodiment.

In FIG. 7, a fluorescent plate 15 is a fluorescent plate using the rare earth aluminum garnet type Ce phosphor of the present invention explained in Embodiment 1, and includes, for example, a substrate 16 and a layer of the rare earth aluminum garnet type Ce phosphor explained in Embodiment 1 formed on one side of the substrate 16. First light sources 17a are light sources for exciting the rare earth aluminum garnet type Ce phosphor explained in Embodiment 1, and are each the solid-state light-emitting element 6, for example, a blue LD that emits purple or blue light and has an emission peak in a wavelength range of, for example, 400 nm or more and less than 480 nm.

As shown in FIG. 7, in the light source device 14 according to the present embodiment, the rare earth aluminum garnet type Ce phosphor formed on the fluorescent plate 15 is at least directly or indirectly irradiated with purple or blue light emitted by the first light sources 17a. And at least a blue-green or green light component, which is purple or blue light wavelength converted by the rare earth aluminum garnet type Ce phosphor, is outputted.

In the exemplary structure shown in FIG. 7, the light source device is provided with two or more first light sources 17a. Purple or blue light emitted by the first light sources 17a is reflected by a reflection mirror 18, and is condensed by a first lens 19a. Then, the rare earth aluminum garnet type Ce phosphor formed on one side of the fluorescent plate 15 is irradiated with the condensed light. Further, of the fluorescent plate 15, the side on which the rare earth aluminum garnet type Ce phosphor is not formed is provided with a reflection surface (not illustrated), and the reflection surface reflects the blue-green or green light component 13 emitted by the rare earth aluminum garnet type Ce phosphor in the opposite direction to the traveling direction of purple or blue light emitted by the first light sources 17a.

In the light source device 14 having such an exemplary structure, the blue-green or green light component 13 emitted by the rare earth aluminum garnet type Ce phosphor is reflected by the reflection surface of the fluorescent plate 15, and is condensed by a first condensing lens 20a. Then, the light component is condensed and subjected to optical axis conversion alternately by a first optical axis conversion mirror 21a, a second lens 19b, a second optical axis conversion mirror 21b, a third lens 19c, and a third optical axis conversion mirror 21c. Subsequently, the light enters an incident lens 22 and is outputted from the light source device 14.

For example, if a composition that emits green light with good color purity is used as the rare earth aluminum garnet type Ce phosphor explained in Embodiment 1, and the thickness of the fluorescent film constituting the fluorescent plate 15 is increased to allow the rare earth aluminum garnet type Ce phosphor to absorb purple or blue light emitted by the first light sources 17a sufficiently, a green light component with good color purity can be outputted from the light source device 14.

To make the light source device 14 compatible with multicolor display, the light source device 14 may be configured to further output blue and red light components through the incident lens 22, for example.

An adequate blue light component can be obtained as follows. For example, by using blue LDs as the first light sources 17a, blue light components emitted by the blue LDs are allowed to pass through the fluorescent plate 15. Then, after being condensed and subjected to optical axis conversion by the second condensing lens 20b, a fourth optical axis conversion mirror 21b, and a fourth lens 19d, the blue light components are outputted from the light source device 14.

Such a light source device 14 can be achieved as follows. For example, a motor 23 or the like is used to make the fluorescent plate 15 rotatable so as to provide a segment area in which the rare earth aluminum garnet type Ce phosphor is irradiated with purple or blue light emitted by the first light sources 17a and a segment area through which purple or blue light emitted by the first light sources 17a passes without impinging upon the rare earth aluminum garnet type Ce phosphor.

Further, an adequate red light component can be obtained as follows. For example, a second light source 17b such as a red LED that emits red light is provided to emit red light components. After being condensed and subjected to optical axis conversion alternately by the second lens 19b, a second optical axis conversion mirror 21b, a third lens 19c, and a third optical axis conversion mirror 21c, red light components emitted by the second light source 17b are outputted from the light source device 14.

If being configured in this way, the light source device can serve as a light source device for multicolor display that emits controlled light components of red, green, and blue, the primary colors of light, by controlling the output from the first light sources 17a, the output from the second light source 17b, and the rotation speed of the fluorescent plate 15.

Further, such a light source device can be used in a projection-type display device. For example, by condensing light outputted from the light source device 14 through, for example, a micro mirror display element called an optical modulator (digital micro-mirror device: DMD) (not shown) or a liquid crystal plate, and projecting the optically modulated light onto a screen (not shown) or the like, a display image in sync with a modulation signal can be obtained.

Note that the light source device according to the present embodiment is not limited to the light source device explained above with reference to FIG. 7, which outputs light components including blue light components emitted by the first light sources 17a as blue LDs, red light components emitted by the second light source 17b as a red LED, and blue-green or green light components emitted by the rare earth aluminum garnet type Ce phosphor. Various specific examples of the light source device according to the present embodiment can be considered, which are characterized in outputting at least a light component of each color that has been wavelength converted by the rare earth aluminum garnet type phosphor of the present invention explained in Embodiment 1.

For example, blue LEDs can be used as the first light sources 17a and a red LD can be used as the second light source 17b. Further, it is also possible to configure a light source device that emits controlled red, green, and blue light components by using blue LDs as the first light sources 17a, and configuring the fluorescent plate 15 to be rotatable and to have a segment area in which the rare earth aluminum garnet type Ce phosphor and a red phosphor are irradiated with blue light emitted by the blue LDs and the phosphors output green light and red light, respectively, and a segment area through which blue light passes without impinging upon any of the phosphors.

Moreover, it is also possible to configure a light source device that emits controlled red, green, and blue light components by using purple LDs as the first light sources 17a, and configuring the fluorescent plate 15 to be rotatable and to have a segment area in which a blue phosphor, the rare earth aluminum garnet type Ce phosphor, and a red phosphor are irradiated with purple light emitted by the purple LDs and the phosphors output blue light, green light and red light, respectively. In addition to these, a variety of other modified examples can be considered.

Further, the light source device according to the present embodiment can be used in a projector (not shown) using solid-state light-emitting elements (e.g., an LED projector, a laser projector, or the like). The projector as a light source has the same advantage as that of the semiconductor light-emitting device according to the present embodiment described above, i.e., being capable of providing a display device with a wide displayable color range by using the rare earth aluminum garnet type phosphors that require no rare and expensive elements.

For example, a projector as the light source device according to the present embodiment can be configured adequately by at least combining the light source device 14 explained with reference to FIG. 7, a driving circuit for driving the light source device 14, an optical modulator, and a driving circuit for driving the optical modulator. If needed, the projector further can be combined with a screen to configure a display device. An exemplary displayable color range of the display device is identical to the range indicated by the dotted line A in FIG. 6. Thus, it is possible to achieve a projector with a wide color reproduction range.

Note that the light-emitting device of the present invention can be used in wide variety of applications as the semiconductor light-emitting device and the light source device described above as well as other light-emitting devices using the rare earth aluminum garnet type phosphor. In particular, it can be used as a light-emitting device that has good properties in terms of green hue and allows a reduction in the production cost.

By using the above-described light-emitting device of the present invention, it is possible to achieve a variety of electronic devices, such as flying-spot electron tubes, plasma display panels with the capability of displaying three-dimensional images (3D-PDP), white LEDs as semiconductor light-emitting devices, projectors using LEDs or LDs and phosphors, illumination light sources using white LEDs, liquid crystal panels with an LED backlight, and sensors and sensitizers using phosphors.

EXAMPLES

Hereinafter, Examples of the rare earth aluminum garnet type phosphor of the present invention will be explained.

The rare earth aluminum garnet type phosphors of the present invention were synthesized by a general ceramics technique using a solid phase reaction, and their characteristics were evaluated.

In Examples, powders of the following compounds were used as raw materials

Scandium oxide ($Sc_2O_3$): purity 3N, manufactured by Shin-Etsu Chemical Co. Ltd.

Yttrium oxide ($Y_2O_3$): purity 3N, manufactured by Shin-Etsu Chemical Co. Ltd.

Lanthanum oxide ($La_2O_3$): purity 4N, manufactured by Shin-Etsu Chemical Co. Ltd.

Ceric oxide ($CeO_2$): purity 4N, manufactured by Shin-Etsu Chemical Co. Ltd.

Praseodymium oxide ($Pr_6O_{11}$): purity 3N, manufactured by Shin-Etsu Chemical Co. Ltd.

Europium oxide ($Eu_2O_3$): purity 3N, manufactured by Shin-Etsu Chemical Co. Ltd.

Terbium oxide ($Tb_4O_7$): purity 4N, manufactured by Shin-Etsu Chemical Co. Ltd.

Lutetium oxide ($Lu_2O_3$): purity 2N5, manufactured by Shin-Etsu Chemical Co. Ltd.

Aluminum oxide ($\theta$-$Al_2O_3$): purity >4N5, manufactured by Sumitomo Chemical Co. Ltd.

Gallium oxide ($Ga_2O_3$): purity 3N, manufactured by Kojundo Chemical Lab Co. Ltd.

Magnesium oxide (MgO): purity 4N, manufactured by Kojundo Chemical Lab Co. Ltd.

Calcium carbonate ($CaCO_3$): purity 2N5, manufactured by Kanto Chemical Co. Inc.

Strontium carbonate ($SrCO_3$): purity 4N, manufactured by Wako Pure Chemical Industries, Ltd.

Barium carbonate ($BaCO_3$): purity 4N, manufactured by Wako Pure Chemical Industries, Ltd.

Zirconium oxide ($ZrO_2$): purity 3N, manufactured by Kanto Chemical Co. Inc.

Hafnium oxide ($HfO_2$): purity 98.5%, manufactured by Daiichi Kigenso Kagaku Co. Ltd.

Manganese carbonate ($MnCO_3$): purity >3N, manufactured by Kojundo Chemical Lab Co. Ltd.

For the purpose of improving the reactivity of raw materials, AKP-G008, aluminum oxide manufactured by Sumitomo Chemical Co. Ltd., was used.

Further, as reaction accelerators, the following were used in Examples:

aluminum fluoride ($AlF_3$): purity 3N, manufactured by Kojundo Chemical Lab. Co. Ltd; and potassium carbonate ($K_2CO_3$): purity 2N5, manufactured by Kanto Chemical Co. Inc.

Examples 1 to 6

For rare earth aluminum garnet type phosphors of Examples 1 to 6, YAG:Ce-type phosphors as compounds represented by the composition formula $0.98(Y_{3-x}Ca_xAl_{5-x}Zr_xO_{12})\cdot 0.02Ce_3Al_5O_{12}$, i.e., compounds represented by the chemical formula $(Y_{(1-y)(1-x/3)}Ca_{(1-y)x/3}Ce_y)_3(Al_{1-(1-y)x/5}Zr_{(1-y)x/5})_5O_{12}$ (where $0.125 \le x \le 2$, and $y=0.02$) were prepared.

As Comparative Example, a conventional YAG:Ce-type phosphor was also prepared in a similar manner.

To obtain compounds with the stoichiometric composition $(Y_{0.98(1-x/3)}Ca_{0.98x/3}Ce_{0.02})_3(Al_{1-0.98x/5}Zr_{0.98x/5})_5O_{12}$ by reaction, each of the above listed raw materials was balanced, and a trace amount of reaction accelerator was further used.

Specific proportions of the weighted raw materials and reaction accelerator used in Examples 1 to 6 were set as shown in Table 1.

TABLE 1

| | x | $Y_2O_3$ (g) | $CeO_2$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 1 | 0.125 | 16.001 | 0.516 | 0.613 | 13.038 | 0.755 | 0.063 | 0.035 |
| Ex. 2 | 0.25 | 15.306 | 0.516 | 1.226 | 12.710 | 1.509 | 0.063 | 0.035 |
| Ex. 3 | 0.5 | 13.914 | 0.516 | 2.452 | 12.056 | 3.019 | 0.063 | 0.035 |
| Ex. 4 | 1.0 | 11.131 | 0.516 | 4.904 | 10.746 | 6.038 | 0.063 | 0.035 |
| Ex. 5 | 1.5 | 8.348 | 0.516 | 7.356 | 9.436 | 9.057 | 0.063 | 0.035 |
| Ex. 6 | 2.0 | 5.566 | 0.516 | 9.809 | 8.126 | 12.076 | 0.063 | 0.035 |
| Comp. Ex | 0 | 16.697 | 0.516 | 0.000 | 13.365 | 0.000 | 0.063 | 0.035 |

These raw materials and the reaction accelerator were adequately wet blended with a proper amount of water (pure water) using a ball mill.

The blended raw materials were placed in a container, and were dried for one night at 120° C. with a drier. The dried blended raw materials were mixed using a mortar and a pestle to obtain raw materials to be fired.

The raw materials to be fired were placed in an alumina melting pot with a lid, and were fired in an atmosphere for 4 hours at 1,600° C. using a box-type electric furnace, thus obtaining samples of Examples 1 to 6 and Comparative Example. For convenience of the experiment, after treatment was not performed.

Hereinafter, the results of characteristic evaluation of the YAG:Ce-type phosphors of Examples 1 to 6 will be explained.

First, the crystal structure of each of the YAG:Ce-type phosphors of Examples 1 to 6 was evaluated with an X-ray diffraction apparatus (X'Pert PRO (product name) manufactured by Spectris Co. Ltd., PANalytical).

Figure 8:
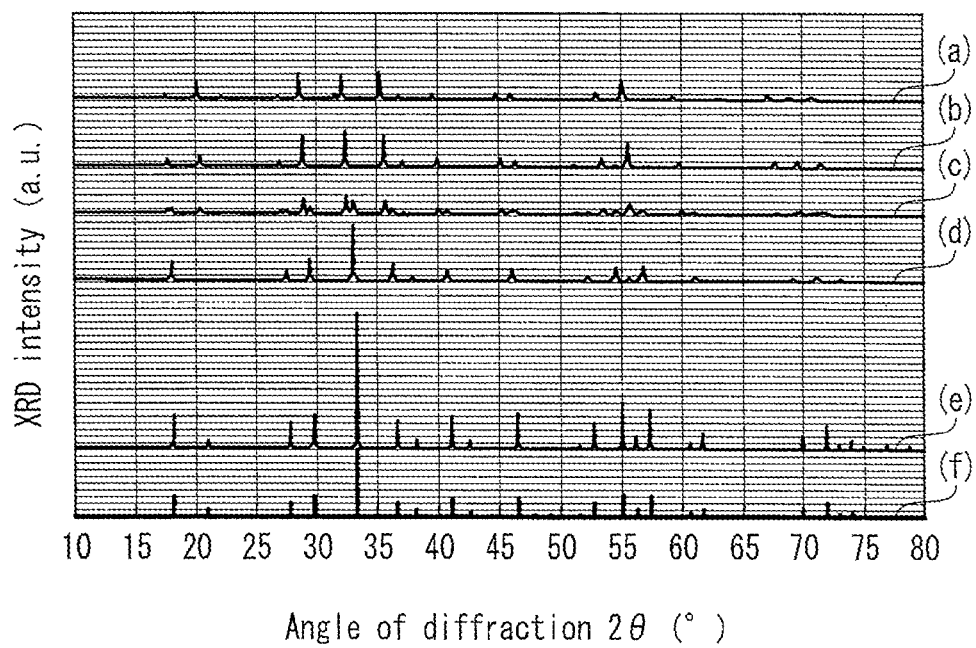
FIG. 8 is a graph showing an XRD pattern of each of YAG:Ce-type phosphors of Examples 3 to 6.

FIG. 8 shows the results of X-ray diffraction (XRD) of Examples 3 to 6 and Comparative Example shown in Table 1.

In FIG. 8, (a) indicates the XRD pattern of Example 6, (b) indicates the XRD pattern of Example 5, (c) indicates the XRD pattern of Example 4, and (d) indicates the XRD pattern of Example 3. Further, for reference, (e) indicates the XRD pattern of Comparative Example, and (f) indicates, as Conventional Example 2, the pattern of $Al_5Y_3O_{12}$ (PDF No. 33-0040), which is recorded on PDF (Power Diffraction Files).

As can be seen from FIG. 8, comparisons of Examples 6 (a), 5 (b), and 3 (c) and Comparative Example (e) and Conventional Example 2 (f) showed that the characteristics of the XRD pattern of each of the YAG:Ce-type phosphors of Examples 3, 5, and 6 matched with those of the XRD pattern of the conventional YAG:Ce-type phosphor as Comparative Example, and with those of the pattern of $Al_5Y_3O_{12}$ as Conventional Example 2 recorded on PDF in terms of pattern form. This suggests that at least the YAG:Ce-type phosphors of Examples 3, 5, and 6 had the same garnet structure as that of the compound $Y_3Al_5O_{12}$.

As can be seen from comparisons of Examples 4 (c), 6 (a), and 5 (e) in FIG. 8, the YAG:Ce-type phosphor of Example 4 (e) showed an XRD pattern (c) close to two kinds of patterns: the pattern of Example 6 (a) and that of the conventional YAG:Ce-type phosphor as Conventional Example (e). This suggests that the YAG:Ce-type phosphor of Example 4 was a mixture of two compounds having a garnet structure.

Further, as can be seen from comparisons of Examples 6 (a), 5 (b), and 3 (d) and Comparative Example (e) in FIG. 8, the peak of the XRD pattern of each of the YAG:Ce-type phosphors of Examples 3 (d), 5 (b), and 6 (a) shifted toward the low angle side as the amount of Ca and Zr used in the replacement (i.e., x) was increased.

Figure 9:
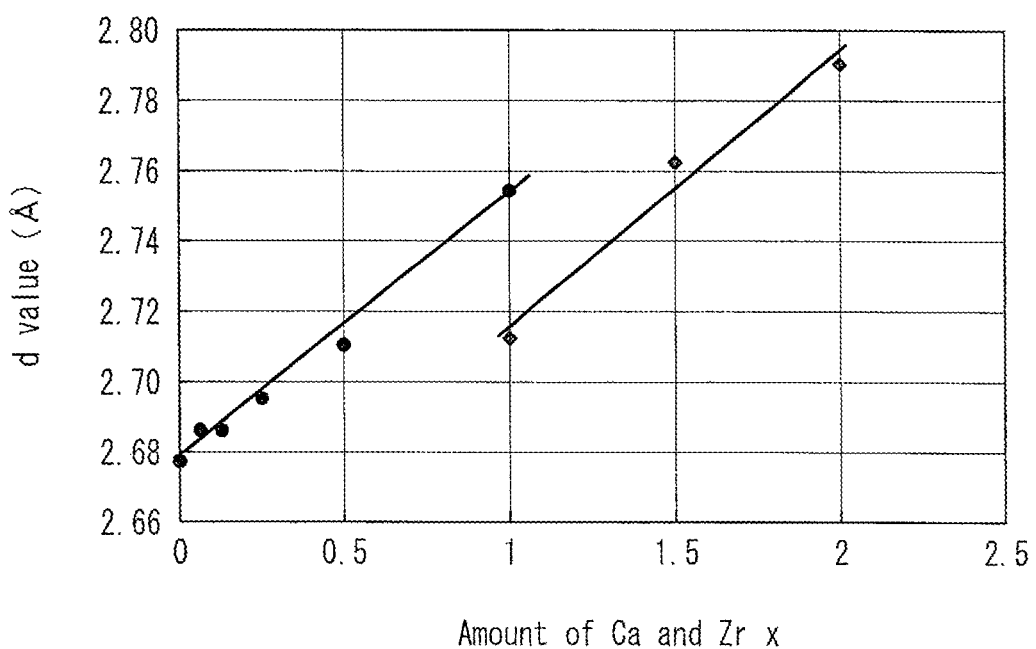
FIG. 9 is a graph showing the relationship between a d value on (420) plane of the YAG:Ce-type phosphors of Examples 1 to 6 and the amount of Ca and Zr used in the replacement.

For each of the YAG:Ce-type phosphors of Examples 1 to 6, on the basis of XRD diffraction angle (2θ) at the main peak of the XRD pattern around 33° (diffraction line of the (420) plane), a d value concerning (420) plane was calculated. FIG. 9 is a graph showing the relationship between the amount of Ca and Zr used in the replacement (x) and d values. As mentioned above, when x was 1 (x=1), an XRD pattern close to two types of patterns, a pattern close to x=0 and a pattern close to x=2, was found. Thus, in FIG. 9, two types of d values are plotted.

As shown in FIG. 9, d values were discontinuous when x was about 1. However, when x was smaller or lager than 1, they increased substantially in parallel to the amount of Ca and Zr used in the replacement (x).

This suggests the following. That is, the spacing between (420) planes of each of the YAG:Ce-type phosphors increased gradually as the amount of Ca and Zr used in the replacement increased (Examples 1 to 3), but when x became about 1 as in the composition of Example 4, the spacing between the planes became discontinuous. When x became larger than 1, the spacing increased again and the compounds became analogous to the compound $Ca_2YZr_2Al_3O_{12}$, containing a small amount of Ce.

Further, FIGS. 8 and 9 serve as data evidencing that the compound $(Y,Ce)_3Al_5O_{12}$ and the compound $CaZrO_3$ were formed by Ca and Zr being solidly dissolved in a conventional YAG:Ce-type phosphor to form a solid solution together or the new compound $Ca_2(Y,Ce)Zr_2Al_3O_{12}$ and the compound $(Y,Ce)_3Al_5O_{12}$ were formed by Y and Al being solidly dissolved in a new phosphor $Ca_2YZr_2Al_3O_{12}:Ce^{3+}$ to form a solid solution together.

In this way, the results of the analyses shown in FIGS. 8 and 9 evidence that the compounds represented by the chemical formula $(Y_{(1-y)(1-x/3)}Ca_{(1-y)x/3}Ce_y)_3(Al_{1-(1-y)x/5})_5Zr_{(1-y)x/5})_5O_{12}$ (i.e., $(Y,Ca,Ce)_3(Al,Zr)_5O_{12}$) mentioned earlier were synthesized and they were present.

As will be described later, the discontinuity, which was found when x was about 1, can be eased by further replacing a part of Al of a phosphor with an element that can serve as a trivalent metal ion having larger ion radius than $Al^{3+}$, such as Ga or Sc.

Further, it is not clear as to whether Ca replaces the lattice position of Y and Zr replaces the lattice position of Al or Zr replaces the lattice position of Y and Ca replaces the lattice position of Al, so that an academic investigation of this point is desired. That is, there is a possibility that the compounds synthesized were represented by the chemical formula $(Y_{(1-y)(1-x/3)}Zr_{(1-y)x/3}Ce_y)_3(Al_{1-(1-y)x/5}Ca_{(1-y)x/5})_5O_{12}$ (i.e., $(Y,Zr,Ce)_3(Al,Ca)_5O_{12}$). Here, both of the compounds are defined as being represented by the chemical formula $(Y_{(1-y)(1-x/3)}Ca_{(1-y)x/3}Ce_y)_3(Al_{1-(1-y)x/5}Zr_{(1-y)x/5})_5O_{12}$ as above for the sake of convenience.

In this way, it was determined that the YAG:Ce-type phosphors of Examples 1 to 6 were each the compound $(Y,Ca,Ce)_3(Al,Zr)_5O_{12}$.

The structure of garnet generally can be represented by the chemical formula $A_3B'_2(B''O_4)_3$, and it is widely known that $A_3B'_2(SiO_4)_3$ or $A_3B'_2(AlO_4)_3$ obtained by replacing B'' of $A_3B'_2(B''O_4)_3$ with Si or Al is a stable structure. Thus, in the present invention, it is expected that a composition with the total number of atoms of Al and Si being no less than 3 with respect to 12 anions (oxygen, etc.) constituting the crystal of the YAG-type phosphor is present as a stabilized phase. That is, if the YAG-type phosphor includes no Si atom, it may have a composition with the total number of atoms of the partially replacing alkaline earth metal being 2.0 or less with respect to 12 anions constituting the composition (YAG-type phosphor) having a garnet structure. In the technical idea of the present invention, an upper limit to x as the value indicating the amount of Ca and Zr used in the replacement is 2.0, as in this composition range.

Next, the excitation behavior and the emission characteristics of the YAG:Ce-type phosphors of Examples 1 to 6 were evaluated with a fluorescence spectrophotometer (FP-6500 (product name) manufactured by JASCO Corporation).

Figure 10:
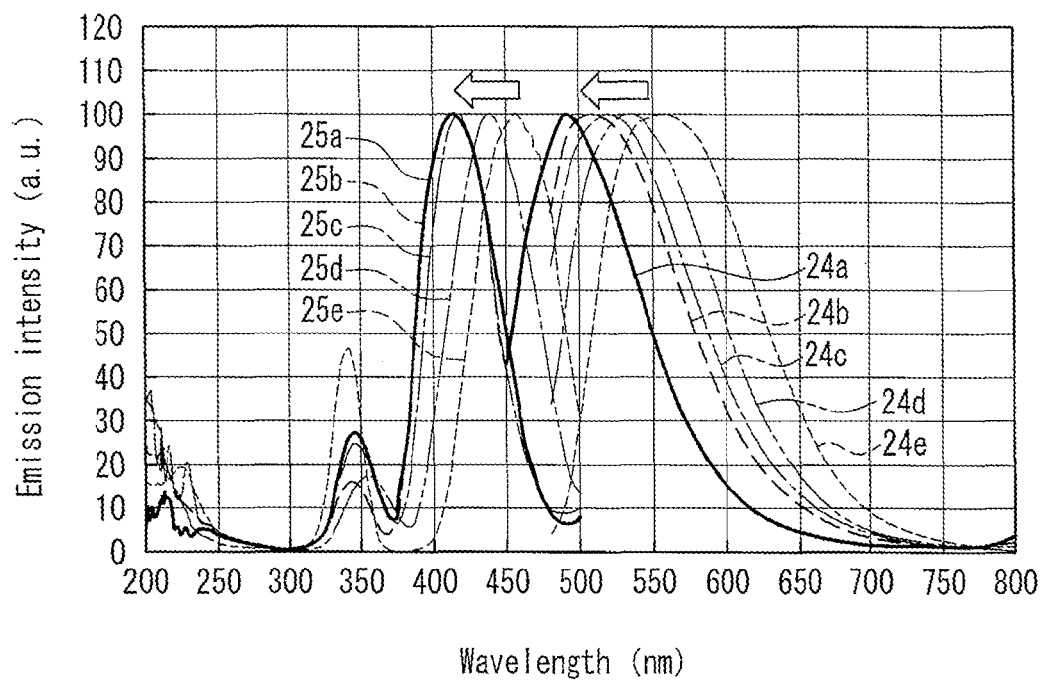
FIG. 10 is a graph showing the excitation spectrum and the emission spectrum of each of YAG:Ce-type phosphors of Examples 3 to 6.

FIG. 10 is a graph showing, all together, the emission spectrum 24a and the excitation spectrum 25a of the YAG:Ce-type phosphor of Example 6, the emission spectrum 24b and the excitation spectrum 25b of the YAG:Ce-type phosphor of Example 5, the emission spectrum 24c and the excitation spectrum 25c of the YAG:Ce-type phosphor of Example 4, the emission spectrum 24d and the excitation spectrum 25d of the YAG:Ce-type phosphor of Example 3, and the emission spectrum 24e and the excitation spectrum 25e of Comparative Example.

In FIG. 10, the excitation wavelength used in measuring each emission spectrum is defined as the peak excitation wavelength, and the monitor wavelength used in measuring each excitation spectrum is defined as the peak emission wavelength. Further, the peak intensity of each emission spectrum and that of each excitation spectrum shown in FIG. 10 are defined as 100.

As can be seen from FIG. 10, each emission spectrum and excitation spectrum shifted relatively toward the short wavelength side as a result of the replacement using Ca and Zr, and the extent to each emission spectrum and excitation spectrum shifted increased with an increase in the amount of Ca and Zr used in the replacement. For Comparative Example (24e, 25e) where the value of x was 0, for example, the peak of the emission spectrum and that of the excitation spectrum were at 557 nm and 458 nm, respectively. For Example 3 (24d, 25d) where the value of x was 0.5, the peak of the emission spectrum and that of the excitation spectrum were at 532 nm and 438 nm, respectively, both being shifted toward the short wavelength side. For Example 4 (24c, 25c) where the value of x was 1, the peak of the emission spectrum and that of the excitation spectrum were at 522 nm and 418 nm, respectively, both being further shifted toward the short wavelength side. Further, for Example 5 (24b, 25b) where the value of x was 1.5, the peak of the emission spectrum and that of the excitation spectrum were at 509 nm and 414 nm, respectively, both being further shifted toward the short wavelength side. Further, for Example 6 (24a, 25a) where the value of x was 2.0, the peak of the emission spectrum and that of the excitation spectrum were at 490 nm and 413 nm, respectively, both being further shifted toward the short wavelength side. And as the emission spectrum of each of the YAG:Ce-type phosphors shifted toward the short wavelength side due to an increase in the amount of Ca and Zr used in the replacement, the color of light emitted by the phosphors changed from yellow-green to pure green, and from blue-green to green-blue.

This suggests that the YAG:Ce-type phosphors of Examples 1 to 6 could absorb purple or blue light having a wavelength of around 400 nm to 460 nm with a high degree of efficiency and wavelength convert the light into pure-green, to blue-green, to green-blue light.

YAG:Ce-type phosphors are known to wavelength convert light having a longer wavelength than the excitation peak on the longest wavelength side of the excitation spectrum with a high degree of photon conversion efficiency (internal quantum efficiency) of about more than 90%, even if the light is deviated from the excitation peak. Thus, it can be said that the YAG:Ce-type phosphors of Examples were highly efficient phosphors that could be excited particularly by purple or blue light and wavelength convert the purple or blue light into pure-green to blue-green to green-blue light with a high degree of photon conversion efficiency.

Conventional YAG:Ce-type phosphors are able to produce pure green to blue-green light only when rare and expensive elements are used to form their compositions, for example, to partially replace Y with Lu or to partially replace Al with Ga. In contrast, in the present invention, it is was possible to produce the YAG:Ce-type phosphors capable of emitting such light colors without using rare and expensive elements.

Examples 7 to 11

For rare earth aluminum garnet type phosphors of Examples 7 to 11, YAG:Ce-type phosphors as compounds represented by the composition formula $(1-x)(Y_{3-x}Ca_x Al_{5-x}Zr_xO_{12}) \cdot_x Ce_3Al_5O_{12}$ but different from each other in amount of $Ce^{3+}$ with which they were activated, i.e., compounds represented by the chemical formula $(Y_{(1-y)(1-x/3)}Ca_{(1-y)x/3}Ce_y)_3(Al_{1-(1-y)x/5}Zr_{(1-y)x/5})_5O_{12}$ (where x=2, and 0.003y≤0.1) were prepared.

To obtain compounds with the stoichiometric composition $(Y_{(1-y)(1/3)}Ca_{(1-y)2/3}Ce_y)_3(Al_{1-0.98x2/5}Zr_{0.98x2/5})_5O_{12}$ by reaction, each of the above listed raw materials was balanced, and a trace amount of reaction accelerator further was used.

Specific proportions of the weighted raw materials and reaction accelerator used in Examples 7 to 11 were set as shown in Table 2.

TABLE 2

|  | x | $Y_2O_3$ (g) | $CeO_2$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 7 | 0.003 | 5.662 | 0.077 | 9.979 | 8.035 | 12.285 | 0.063 | 0.035 |
| Ex. 8 | 0.01 | 5.622 | 0.258 | 9.909 | 8.073 | 12.199 | 0.063 | 0.035 |
| Ex. 9 | 0.02 | 5.566 | 0.516 | 9.809 | 8.126 | 12.076 | 0.063 | 0.035 |
| Ex. 10 | 0.03 | 5.509 | 0.775 | 9.709 | 8.180 | 11.952 | 0.063 | 0.035 |
| Ex. 11 | 0.1 | 5.111 | 2.582 | 9.008 | 8.554 | 11.090 | 0.063 | 0.035 |

Samples of Examples 7 to 11 were prepared and evaluated in a similar manner as in Examples 1 to 6.

After being fired for 4 hours in an atmosphere at 1,600° C. with the box-type electric furnace, the samples of Examples 7 to 11 were subjected to a reduction treatment for two hours in a carbon monoxide atmosphere at 1,400° C. during the preparation. The samples were subjected to a reduction treatment by a double melting pot method as follows. After being fired in an atmosphere at 1,600° C., the phosphors were placed in an alumina melting pot (without a lid), and the melting pot was placed in a larger alumina melting pot with a lid in which a carbon powder was placed.

While the XRD pattern of each of the YAG:Ce-type phosphors of Examples 7 to 11 is not shown because it was similar to that of the phosphor of Example 6 indicated by (a) in FIG. 8, it was determined that the YAG:Ce-type phosphors of Examples 7 to 11 were each the compound $(Y,Ca,Ce)_3(Al,Zr)_5O_{12}$ having a garnet crystal structure and represented by the chemical formula $(Y_{(1-y)(1/3)}Ca_{(1-y)2/3}Ce_y)_3(Al_{1-0.98x2/5}Zr_{0.98x2/5})_5O_{12}$.

Figure 11:
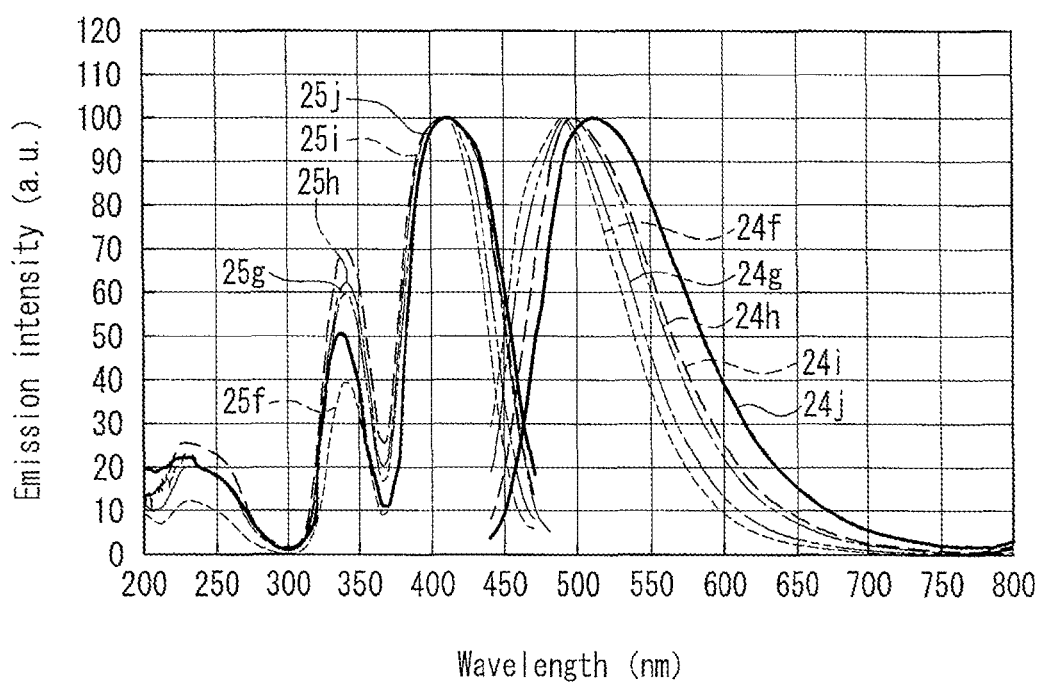
FIG. 11 is a graph showing the excitation spectrum and the emission spectrum of each of YAG:Ce-type phosphors of Examples 7 to 11.

The emission spectrum 24 and the excitation spectrum 25 of each of the YAG:Ce-type phosphors of Examples 7 to 11 were evaluated in a similar manner as in Examples 1 to 6. FIG. 11 shows the results.

FIG. 11 is a graph showing, all together, the emission spectrum 24f and the excitation spectrum 25f of the YAG:Ce-type phosphor of Example 7, the emission spectrum 24g and the excitation spectrum 25g of the YAG:Ce-type phosphor of Example 8, the emission spectrum 24h and the excitation spectrum 25h of the YAG:Ce-type phosphor of Example 9, the emission spectrum 24i and the excitation spectrum 25i of the YAG:Ce-type phosphor of Example 10, and the emission spectrum 24j and the excitation spectrum 25j of the YAG:Ce-type phosphor of Example 11.

In FIG. 11, the excitation wavelength used in measuring each emission spectrum and the monitor wavelength used in measuring each excitation spectrum are defined as 410 nm and 500 nm, respectively. Further, the peak of each emission spectrum and that of each excitation spectrum shown in FIG. 11 are defined as 100.

As can be seen from FIG. 11, the wavelength of the emission peak shifted from 490 nm to 513 as the value of y (corresponding to the amount of $Ce^{3+}$ as an activator) increased from 0.003. And as the emission spectrum shifted toward the long wavelength side, the color of light emitted by the YAG:Ce-type phosphors changed from blue-green to green-blue to pure green. On the other hand, the wavelength of each excitation peak hardly changed and remained around 410 nm even when the value of y was changed.

This suggests that the YAG:Ce-type phosphors of Examples 7 to 11 could efficiently absorb purple light having a wavelength around 410 nm and wavelength convert it into green-blue, blue-green or pure green light whose emission peak resided in a wavelength range of 490 nm or more and less than 515 nm.

For conventional YAG:Ce-type phosphors, it is possible to reduce the wavelength of the emission peak to about 530 nm and to achieve light colors from yellow-green to pure green if rare and expensive elements are used to form the composition, for example, to partially replace Y with Lu or partially replace Al with Ga. In the present invention, it was possible to reduce the wavelength further and to produce the YAG:Ce-type phosphors capable of emitting light colors up to green-blue without using rare and expensive elements.

As can be seen from a comparison between the aforementioned emission spectrum 24a of Example 6 shown in FIG. 10 (wavelength of emission peak: 490 nm) and the emission spectrum 24h of Example 9 shown in FIG. 11 (wavelength of emission peak: 494 nm), the wavelength of the emission peak somewhat moved toward the long wavelength side due to the reduction treatment. Further, for each of the YAG:Ce-type phosphors of Examples 7 to 11 subjected to the reduction treatment, the peak of the emission spectrum resides in a wavelength range of 490 nm or more and less than 515 nm depending on the amount of $Ce^{3+}$ as an activator. Therefore, it is clear that the YAG:Ce-type phosphors of the present invention shown as Examples 1 to 11 can be controlled such that their emission peak resides in a wavelength range of 485 nm or more and less than 540 nm, particularly in a wavelength range of 505 nm or more and less than 535 nm. Similarly, it can be said that the YAG:Ce-type phosphors of the present invention can be controlled such that the peak of their excitation spectrum resides in a wavelength range of more than 400 nm and less than 450 nm, particularly more than 405 nm and less than 440 nm.

Example 12

For a rare earth aluminum garnet type phosphor of Example 12, a YAG:Ce-type phosphor co-activated with $Ce^{3+}$ and $Pr^{3+}$ as a compound represented by the composition formula $0.98(Y_{3-x}Ca_xAl_{5-x}Zr_xO_{12}) \cdot 0.02(Ce_{0.9}Pr_{0.1})_3Al_5O_{12}$, i.e., a compound represented by the chemical formula $(Y_{(1-y-z)(1-x/3)}Ca_{(1-y-z)x/3}Ce_yPr_z)_3(Al_{1-(1-y-z)x/5}Zr_{(1-y-z)x/5})_5O_{12}$ (where x=0.5, y=0.018, and z=0.002) was prepared.

To obtain a compound with the stoichiometric composition $(Y_{0.98x2.5/3}Ca_{0.98x0.5/3}Ce_{0.02x0.9}Pr_{0.02x0.1})_3(Al_{1-0.98x0.5/5}Zr_{0.98x0.5/5})_5O_{12}$ by solid phase reaction as in Examples 1 to 6, each of the raw materials was balanced, and a trace amount of reaction accelerator was further used.

Specific proportions of the weighted raw materials and reaction accelerator used in Example 12 were set as shown in Table 3.

TABLE 3

| | $Y_2O_3$ (g) | $CeO_2$ (g) | $Pr_6O_{11}$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 12 | 13.914 | 0.465 | 0.051 | 2.452 | 12.056 | 3.019 | 0.063 | 0.035 |

A sample of Example 12 was prepared in a similar manner as in Examples 1 to 6.

While the XRD pattern of the YAG:Ce-type phosphor of Example 12 is not shown because it was similar to that of the phosphor of Example 3 indicated by (d) in FIG. 8, it was determined that the YAG:Ce-type phosphor of Example 12 was the compound (Y, Ca, Ce,Pr)$_3$(Al,Zr)$_5$O$_{12}$ having a garnet crystal structure and represented by the chemical formula $(Y_{(1-y-z)(1-x/3)}Ca_{(1-y-z)x/3}Ce_yPr_z)_3(Al_{1-(1-y-z)x/z}Zr_{(1-y-z)x/5})_5O_{12}$.

Figure 12:
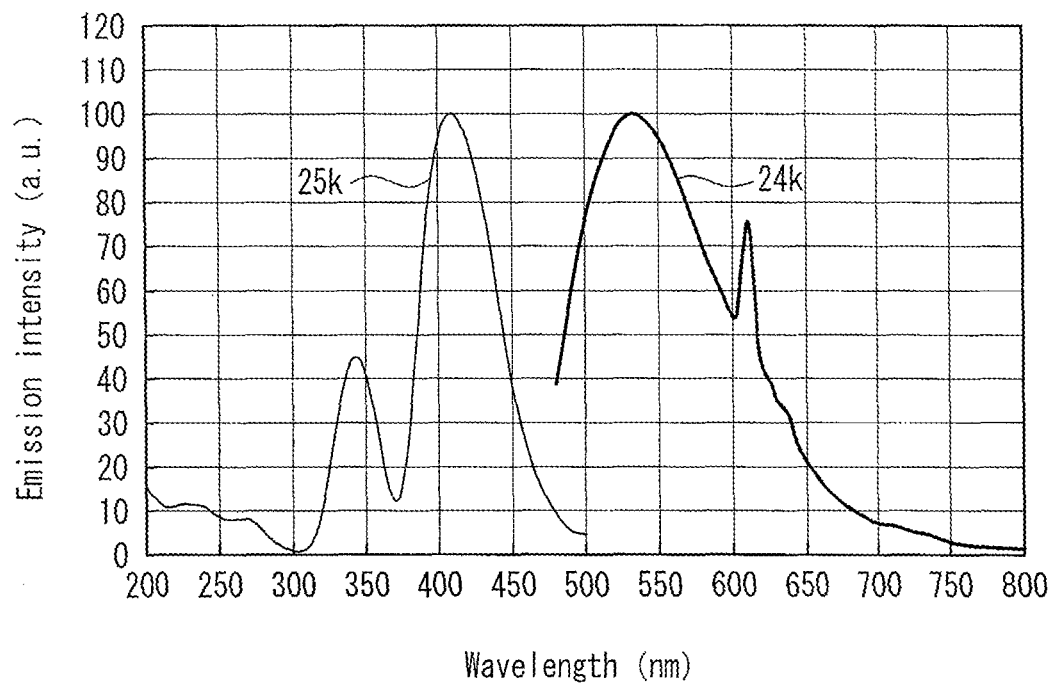
FIG. 12 is a graph showing the excitation spectrum and the emission spectrum of a YAG:Ce-type phosphor of Example 12.

FIG. 12 shows the emission spectrum 24k and the excitation spectrum 25k of the YAG:Ce-type phosphor of Example 12 as with those of Examples 1 to 6. In FIG. 12, the excitation wavelength used in measuring the emission spectrum and the monitor wavelength used in measuring the excitation spectrum are defined as 410 nm and 500 nm, respectively. Further, the peak of the emission spectrum and that of the excitation spectrum shown in FIG. 12 are defined as 100.

As can be seen from FIG. 12, the emission spectrum 24k peaked in a green wavelength range around 532 nm and in a red wavelength range around 610 nm, and the excitation spectrum 25k peaked around 410 nm. This suggests that the phosphor of Example 12 was a YAG:Ce-type phosphor that was excited by purple or blue light and emitted two emission components, i.e., green and red emission components at the same time.

As is clear from, for example, information described in prior art documents on YAG:Ce-type phosphors co-activated with Ce$^{3+}$ and Pr$^{3+}$, the light having a broad spectral bandwidth and an emission peak around 530 nm was emitted by Ce$^{3+}$ and the light having a narrow spectral bandwidth and an emission peak around 610 nm was emitted by Pr$^{3+}$.

It was determined that the YAG:Ce-type phosphor of the present invention was a phosphor that simultaneously emitted two emission peak components: a green emission peak component with excellent color purity and a red emission peak component.

Examples 13, 14

For rare earth aluminum garnet type phosphors of Examples 13 and 14, YAG-type phosphors respectively activated with the rare earth ions Eu$^{3+}$ and Tb$^{3+}$ were prepared. That is, compounds having a rare earth ion other than Ce$^{3+}$ as a luminescent center, namely Eu$^{3+}$ and Tb$^{3+}$, respectively, and represented by the composition formula 0.98(Y$_{3-x}$Ca$_x$Al$_{5-x}$Zr$_x$O$_{12}$)·0.02Ln$_3$Al$_5$O$_{12}$, in other words, compounds represented by the chemical formula $(Y_{(1-y)(1-x/3)}Ca_{(1-y)x/3}Ln_y)_3(Al_{1-(1-y)x/5}Zr_{(1-y)x/5})_5O_{12}$ (where x=0.5, y=0.02, and Ln is Eu or Tb) were prepared.

To obtain a compound with the stoichiometric composition $(Y_{0.98x2.5/3}Ca_{0.98x0.5/3}Eu_{0.02})_3(Al_{1-0.98x0.5/5}Zr_{0.98x0.5/5})_5O_{12}$ and a compound with the stoichiometric composition $(Y_{0.98x2.5/3}Ca_{0.98x0.5/3}Tb_{0.02})_3(Al_{1-0.98x0.5/5}Zr_{0.98x0.5/5})_5O_{12}$ by solid phase reaction as in Examples 1 to 6, each of the raw materials was balanced, and a trace amount of reaction accelerator further was used.

Specific proportions of the weighted raw materials and reaction accelerator used in Examples 13 and 14 were set as shown in Table 4.

TABLE 4

| | $Y_2O_3$ (g) | $Eu_2O_3$ (g) | $Tb_4O_7$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 13 | 13.914 | 0.531 | 0.00 | 2.452 | 12.056 | 3.019 | 0.063 | 0.035 |
| Ex. 14 | 13.914 | 0.00 | 0.561 | 2.452 | 12.056 | 3.019 | 0.063 | 0.035 |

Samples of Examples 13 and 14 were prepared in a similar manner as in Examples 1 to 6.

While the XRD pattern of each of the YAG:Ce-type phosphors of Examples 13 and 14 is not shown because it was also similar to that of the phosphor of Example 3 indicated by (d) in FIG. 8, it was determined that the YAG-type phosphors of Examples 13 and 14 were each the compound (Y,Ca,Ln)$_3$(Al,Zr)$_5$O$_{12}$ having a garnet crystal structure and represented by the chemical formula $(Y_{(1-y)(1-x/3)}Ca_{(1-y)x/3}Ln_y)_3(Al_{1-(1-y)x/5}Zr_{(1-y)x/5})_5O_{12}$ (where Ln is Eu or Tb).

Figure 13:
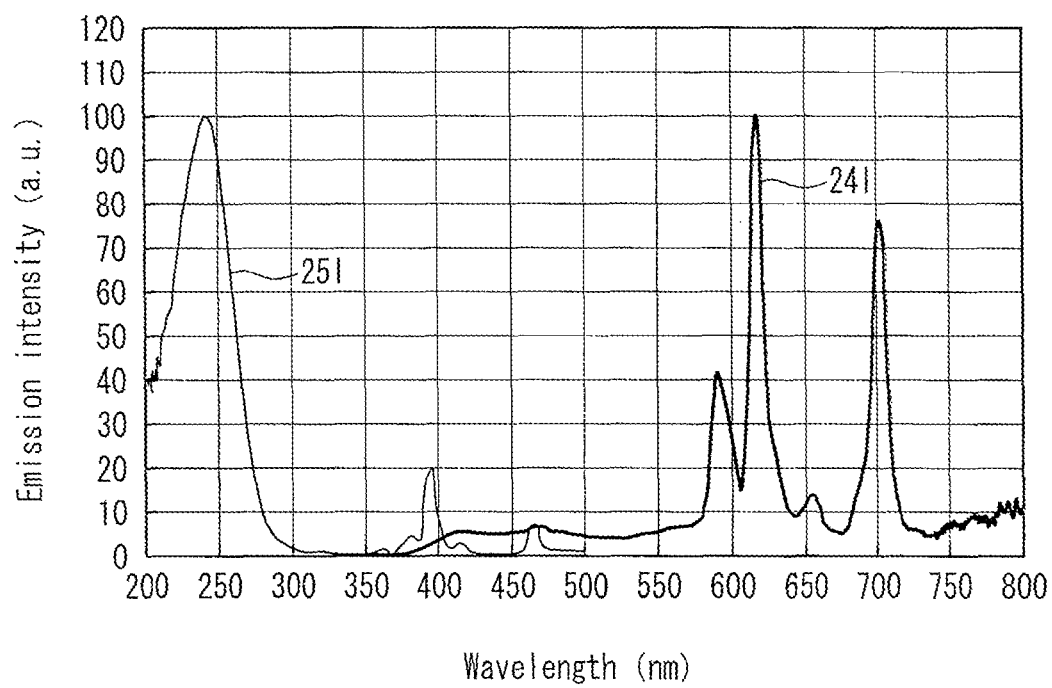
FIG. 13 is a graph showing the excitation spectrum and the emission spectrum of a YAG-type phosphor of Example 13.
Figure 14:
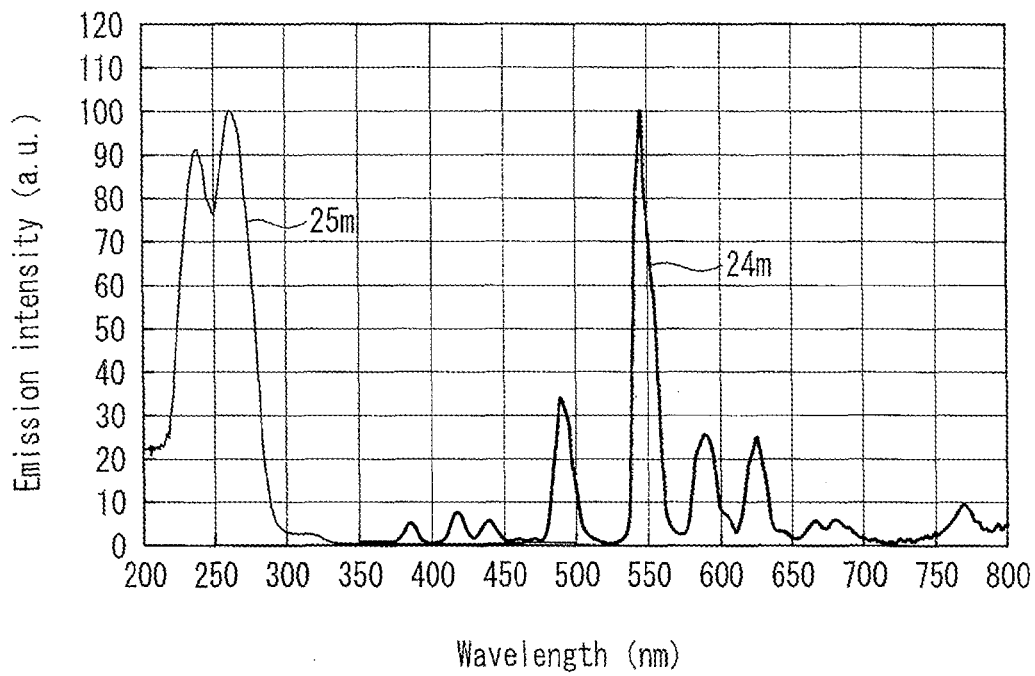
FIG. 14 is a graph showing the excitation spectrum and the emission spectrum of a YAG-type phosphor of Example 14.

The emission spectrum 24l and the excitation spectrum 25l of the YAG-type phosphor of Example 13 were evaluated in a similar manner as in Examples 1 to 6. FIG. 13 shows the results. Further, the emission spectrum 24m and the excitation spectrum 25m of the YAG-type phosphor of Example 14 were evaluated in a similar manner as in Examples 1 to 6. FIG. 14 shows the results. In FIGS. 13 and 14, the excitation wavelength used in measuring each emission spectrum is defined as the peak excitation wavelength, and the monitor wavelength used in measuring each excitation spectrum is defined as the peak emission wavelength. Further, the peak of each emission spectrum and that of each excitation spectrum shown in FIGS. 13 and 14 are defined as 100.

As can be seen from FIG. 13, the emission spectrum 24l of Example 13 peaked in a red wavelength range around 617 nm and the excitation spectrum 25l peaked around 243 nm. This suggests that the YAG-type phosphor of Example 13 was a YAG-type phosphor that was excited by ultraviolet rays and emitted a red emission component. As is clear from information described in prior art documents on phosphors activated with Eu$^{3+}$, the light having a line spectrum and a plurality of emission peaks in a red wavelength range in FIG. 13 was emitted by Eu$^{3+}$.

On the other hand, as can be seen from FIG. 14, the emission spectrum 24m of Example 14 peaked in a green wavelength range around 546 nm and the excitation spectrum 25m peaked around 263 nm. This suggests that the YAG-type phosphor of Example 14 was a YAG-type phosphor that was excited by ultraviolet rays and emitted a green emission component. Further, as is clear from information described in prior art documents on phosphors activated with Tb$^{3+}$, the light having a line spectrum and having a plurality of emission peaks in near-ultraviolet, purple, blue, green, and red wavelength ranges was emitted by Tb$^{3+}$.

From above, it was determined that the YAG-type phosphor of the present invention emitted a red or green light component.

Example 15

For a rare earth aluminum garnet type phosphor of Example 15, a YAG-type phosphor activated with $Mn^{2+}$ as a compound including not $Ce^{3+}$ but a transition metal ion as a luminescent center, namely $Mn^{2+}$, and represented by the composition formula $Y_{3-x}(Ca_{1-y}Mn_y)_xAl_{5-x}Zr_xO_{12}$, i.e., a compound represented by the chemical formula $(Y_{(1-x/3)}(Ca_{1-y}Mn_y)_{x/3})_3(Al_{1-x/5}Zr_{x/5})_5O_{12}$ (where x=0.5, and y=0.01) was prepared.

To obtain a compound with the stoichiometric composition $(Y_{2.5/3}(Ca_{0.99}Mn_{0.01})_{0.5/3})_3(Al_{4.5/5}Zr_{0.5/5})_5O_{12}$ by solid phase reaction as in Examples 1 to 6, each raw material was balanced, and a trace amount of reaction accelerator further was used.

Specific proportions of the weighted raw materials and reaction accelerator used in Example 15 were set as shown in Table 5.

TABLE 5

| | $Y_2O_3$ (g) | $MnCO_3$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|
| Ex. 15 | 14.198 | 0.029 | 2.477 | 12.029 | 3.081 | 0.063 | 0.035 |

A sample of Example 15 was prepared in a similar manner as in Examples 1 to 6.

While the XRD pattern of the YAG-type phosphor of Example 15 is not shown because it was also similar to that of the phosphor of Example 3 indicated by (d) in FIG. 8, it was determined that the YAG-type phosphor of Example 15 was the compound $(Y,Ca,Mn)_3(Al,Zr)_5O_{12}$ having a garnet crystal structure and represented by the chemical formula $(Y_{(1-x/3)}(Ca_{1-y}Mn_y)_{x/3})_3(Al_{1-x/5}Zr_{x/5})_5O_{12}$.

Figure 15:
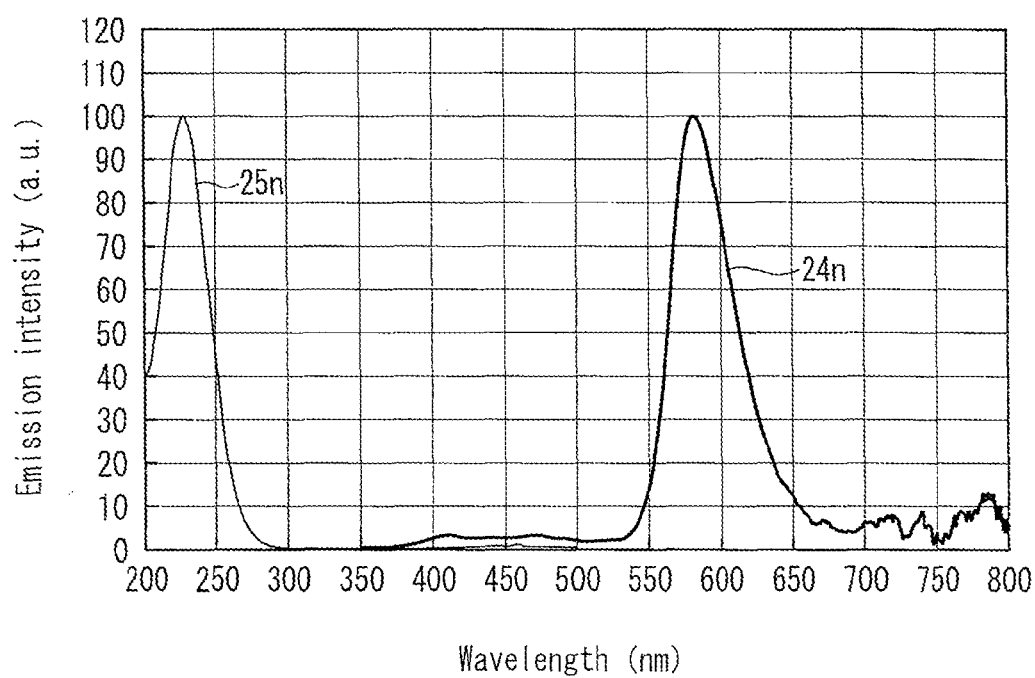
FIG. 15 is a graph showing the excitation spectrum and the emission spectrum of a YAG-type phosphor of Example 15.

The emission spectrum 24n and the excitation spectrum 25n of the YAG-type phosphor of Example 15 were evaluated in a similar manner as in Examples 1 to 6. FIG. 15 shows the results. Also in FIG. 15, the excitation wavelength used in measuring the emission spectrum is defined as the peak excitation wavelength, and the monitor wavelength used in measuring the excitation spectrum is defined as the peak emission wavelength. Further, the peak of the emission spectrum and that of the excitation spectrum shown in FIG. 15 are defined as 100.

As can be seen from FIG. 15, the emission spectrum 24n of Example 15 peaked in an orange wavelength range around 583 nm and the excitation spectrum 25n peaked around 243 nm. This suggests that the YAG-type phosphor of Example 15 was a YAG-type phosphor that was excited by ultraviolet rays and emitted an orange emission component. As is clear from information described in prior art documents on phosphors activated with $Mn^{2+}$, the light having a broad spectrum bandwidth and an emission peak in an orange wavelength range in FIG. 15 was emitted by $Mn^{2+}$.

From above, it was determined that the YAG-type phosphor of the present invention emitted an orange light component.

Example 16

For a rare earth aluminum garnet type phosphor of Example 16, a YAG:Ce-type phosphor as a compound obtained by replacing Zr of Example 4 (in which $Ce^{3+}$ was used as a luminescent center) with Hf was prepared. That is, a compound represented by the composition formula $0.98(Y_{3-x}Ca_xAl_{5-x}Hf_xO_{12})\cdot 0.02Ce_3Al_5O_{12}$, in other words, a compound represented by the chemical formula $(Y_{(1-y)(1-x/3)}Ca_{(1-y)x/3}Ce_y)_3(Al_{1-(1-y)x/5}Hf_{(1-y)x/5})_5O_{12}$ (where x=1.0, and y=0.02) was prepared.

To obtain a compound with the stoichiometric composition $(Y_{0.98x2.5/3}Ca_{0.98x0.5/3}Ce_{0.02})_3(Al_{1-0.98x0.5/5}Hf_{0.98x0.5/5})_5O_{12}$ by solid phase reaction as in Examples 1 to 6, each raw material was balanced, and a trace amount of reaction accelerator further was used.

Specific proportions of the weighted raw materials and reaction accelerator used in Example 16 were set as shown in Table 6.

TABLE 6

| | $Y_2O_3$ (g) | $CeO_2$ (g) | $CaCO_3$ (g) | $Al_2O_3$ (g) | $ZrO_2$ (g) | $HfO_2$ (g) | $AlF_3$ (g) | $K_2CO_3$ (g) |
|---|---|---|---|---|---|---|---|---|
| Ex. 16 | 11.131 | 0.516 | 4.904 | 10.746 | 0.000 | 10.314 | 0.063 | 0.035 |

A sample of Example 16 was prepared in the same manner as in Examples 1 to 6 except that the firing temperature was changed to 1,700° C.

Thereafter, the crystal structure of the YAG:Ce-type phosphor of Example 16 was evaluated in a similar manner as in Examples 1 to 6 with the X-ray diffraction apparatus.

Figure 16:
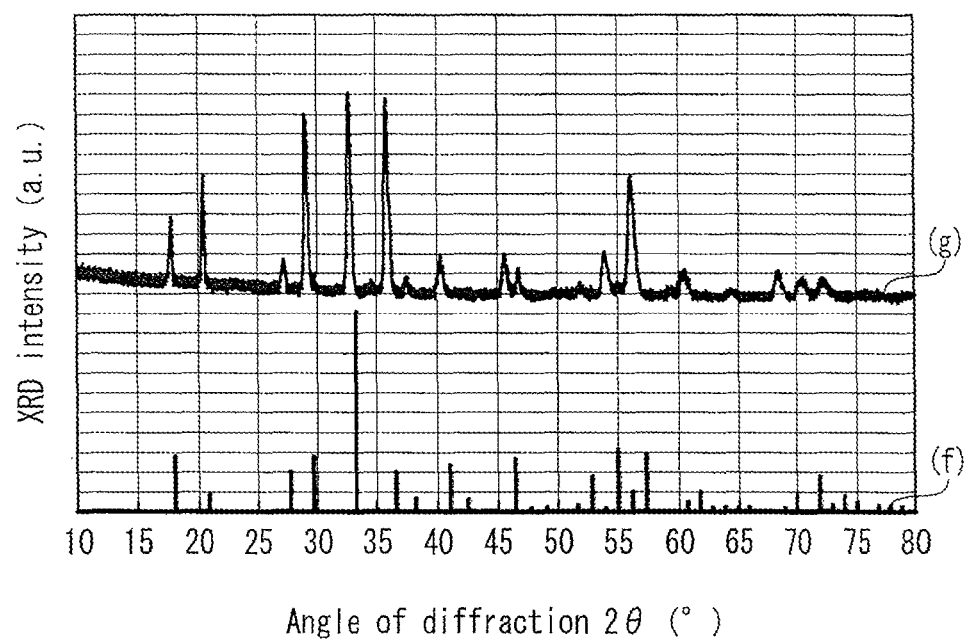
FIG. 16 is a graph showing an XRD pattern of a YAG:Ce-type phosphor of Example 16.

FIG. 16 shows the XRD pattern of Example 6 and that of Conventional Example 2 indicated by (f) in FIG. 8. In FIG. 16, (g) indicates the XRD pattern of Example 16, and (f) indicates the XRD pattern of $Al_5Y_3O_{12}$ (PDF No. 33-0040) as Conventional Example 2.

Comparisons of the XRD pattern of Example 16 (g) shown in FIG. 16, the XRD pattern of Comparative Example (e) and that of Comparative Example 2 (f) shown in FIG. 8 showed that the characteristics of the XRD pattern of the YAG:Ce-type phosphor of Example 16 matched with those of the XRD pattern of the conventional YAG:Ce-type phosphor as Comparative Example, and with those of the pattern of $Al_5Y_3O_{12}$ recorded on PDF in terms of pattern form. This suggests that the YAG:Ce-type phosphor of Example 16 had the same garnet structure as that of the compound $Y_3Al_5O_{12}$.

From above, it was determined that the YAG:Ce-type phosphor of Example 16 was the compound $(Y,Ca,Ce)_3(Al,Hf)_5O_{12}$ having a garnet crystal structure and represented by the chemical formula $(Y_{(1-y)(1-x/3)}Ca_{(1-y)x/3}Ce_y)_3(Al_{1-(1-y)x/5}Hf_{(1-y)x/5})_5O_{12}$. That is, it was found that a YAG-type phosphor could be produced even by replacing Zr of the previous example with Hf.

Figure 17:
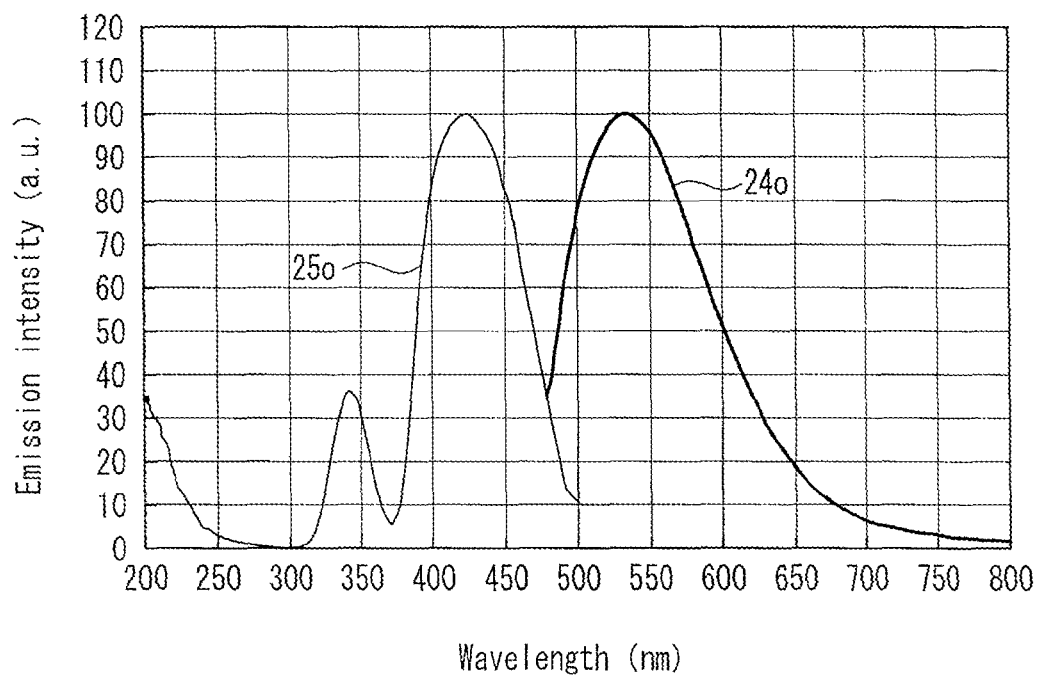
FIG. 17 is a graph showing the excitation spectrum and the emission spectrum of a YAG:Ce-type phosphor of Example 16.

The emission spectrum 24o and the excitation spectrum 25o of the YAG:Ce-type phosphor of Example 16 were evaluated in a similar manner as in Examples 1 to 6. FIG. 17 shows the results.

In FIG. 17, the excitation wavelength used in measuring the emission spectrum and the monitor wavelength used in measuring the excitation spectrum are defined as 440 nm and 540 nm, respectively. Further, the peak of the emission spectrum and that of the excitation spectrum shown in FIG. 17 are defined as 100.

As can be seen from FIG. 17, the emission spectrum 24o of Example 16 peaked in a green wavelength range around 536 nm, and the excitation spectrum 25o peaked around 424 nm. This suggests that the YAG:Ce-type phosphor of Example 16 was a YAG:Ce-type phosphor that was excited by purple or blue light and emitted a green emission components with an excellent hue.

From the above, it was determined that the YAG:Ce-type phosphor of the present invention could emit a green light component even when Hf was used in place of Zr.

Examples 17, 18

For rare earth aluminum garnet type phosphors of Examples 17 and 18, YAG:Ce-type phosphors as compounds obtained by replacing Ca of Example 4 (in which $Ce^{3+}$ was used as a luminescent center) with Mg (Example 17) and with Sr (Example 18) were prepared. That is, compounds represented by the composition formula $0.98(Y_{3-x}M_xAl_{5-x}Zr_xO_{12})\cdot0.02Ce_3Al_5O_{12}$ (where M is Mg or Sr), in other words, compositions represented by the chemical formula $(Y_{(1-y)(1-x/3)}M_{(1-y)x/3}Ce_y)_3(Al_{1-(1-y)x/5}Zr_{(1-y)x/5})_5O_{12}$ (where x=0.5, y=0.02, and M is Mg or Sr) were prepared.

To obtain a compound with the stoichiometric composition $(Y_{0.98x2.5/3}Mg_{0.98x0.5/3}Ce_{0.02})_3(Al_{1-0.98x0.5/5}Zr_{0.98x0.5/5})_5O_{12}$ and a compound with the stoichiometric composition $(Y_{0.98x2.5/3}Sr_{0.98x0.5/3}Ce_{0.02})_3(Al_{1-0.98x0.5/5}Zr_{0.98x0.5/5})_5O_{12}$ by solid phase reaction as in Examples 1 to 6, each raw material was balanced, and a trace amount of reaction accelerator was further used.

Specific proportions of the weighted raw materials and reaction accelerator used in Examples 17 and 18 were set as shown in Table 7.

TABLE 7

| | $Y_2O_3$ (g) | $CeO_2$ (g) | MgO (g) | $SrCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 17 | 13.914 | 0.516 | 0.988 | — | 12.056 | 3.019 | 0.063 | 0.035 |
| Ex. 18 | 11.131 | 0.516 | — | 3.617 | 10.746 | 0.000 | 0.063 | 0.035 |

Samples of Examples 17 and 18 were prepared in a similar manner as in Examples 1 to 6.

Thereafter, the crystal structure of each of the YAG:Ce-type phosphors of Examples 17 and 18 was evaluated in a similar manner as in Examples 1 to 6 with the X-ray diffraction apparatus.

FIG. 8 shows the XRD pattern of each of Examples 17 and 18 and Comparative Example 2.

Figure 18:
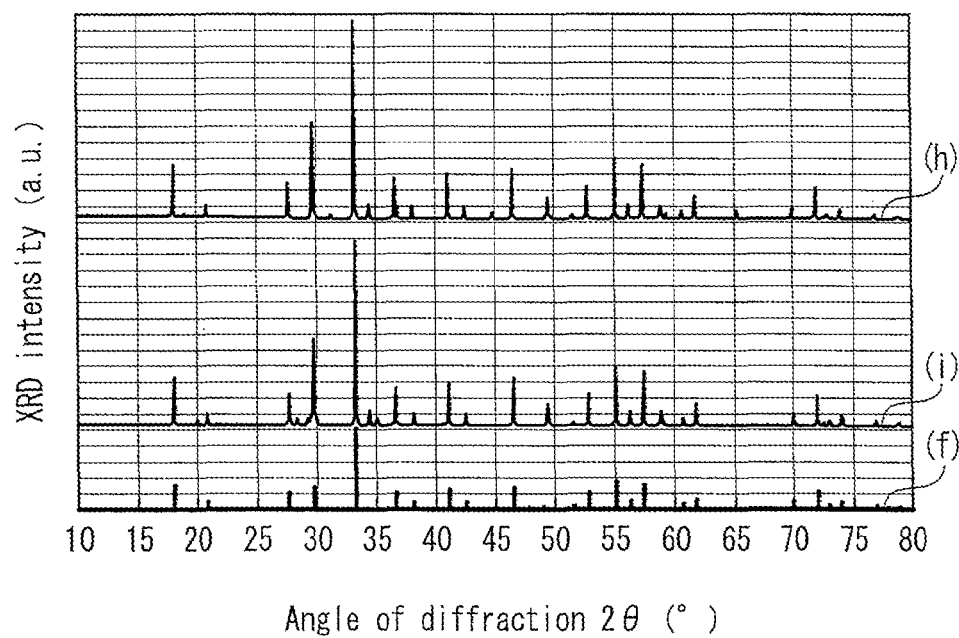
FIG. 18 is a graph showing an XRD pattern of each of YAG:Ce-type phosphors of Examples 17 and 18.

In FIG. 18, (h) indicates the XRD pattern of Example 17, and (i) indicates the XRD pattern of Example 19. For reference, the pattern of $Al_5Y_3O_{12}$ (PDF No. 33-0040) as Conventional Example 2 is indicated by (f).

Comparisons of the XRD pattern of Example 17 (h), the XRD pattern of Comparative Example (i) and the XRD pattern of Comparative Example 2 (f) shown in FIG. 18 showed that the characteristics of the XRD pattern of each of the YAG:Ce-type phosphors of Examples 17 and 18 substantially matched with those of the pattern of $Al_5Y_3O_{12}$ as Example 2 recorded on PDF in terms of pattern form. This suggests that the YAG:Ce-type phosphors of Examples 17 and 18 had the same garnet structure as that of the compound $Y_3Al_5O_{12}$.

From the above, it was determined that the YAG:Ce-type phosphor of Example 17 was the compound $(Y,Mg,Ce)_3(Al,Zr)_5O_{12}$ having a garnet crystal structure and represented by the chemical formula $(Y_{(1-y)(1-x/3)}Mg_{(1-y)x/3}Ce_y)_3(Al_{1-(1-y)x/5}Zr_{(1-y)x/5})_5O_{12}$ and the YAG:Ce-type phosphor of Example 18 was the compound $(Y,Sr,Ce)_3(Al,Zr)_5O_{12}$ having a garnet crystal structure and represented by the chemical formula $(Y_{(1-y)(1-x/3)}Sr_{(1-y)x/3}Ce_y)_3(Al_{1-(1-y)x/5}Zr_{(1-y)x/5})_5O_{12}$.

That is, it was found that YAG-type phosphors could be produced even by replacing Ca of the previous example with Mg or Sr.

Figure 19:
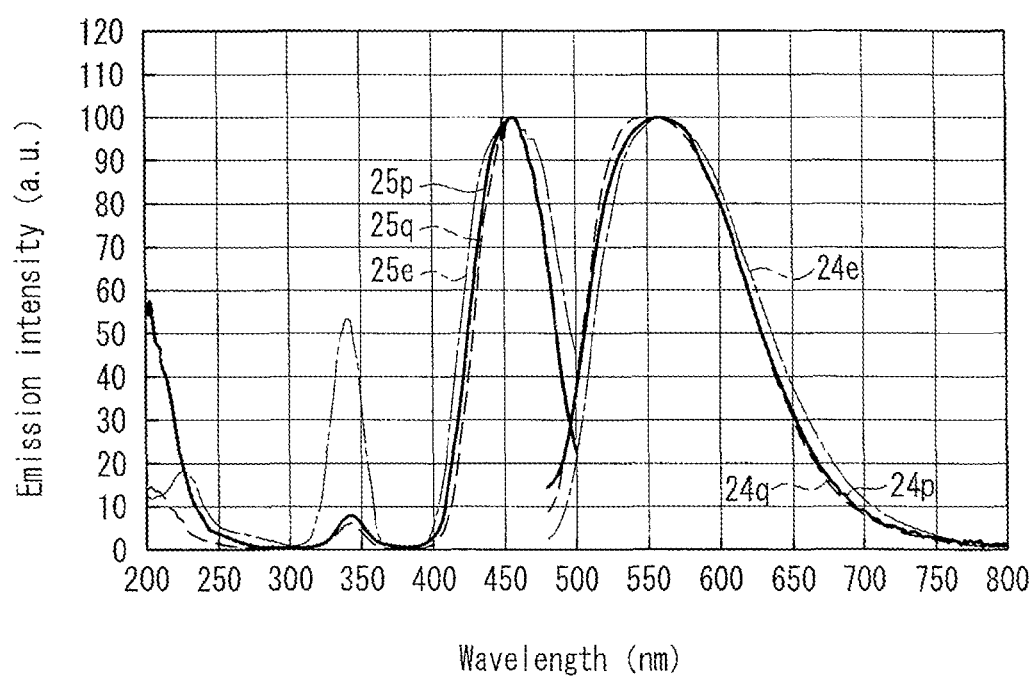
FIG. 19 is a graph showing the excitation spectrum and the emission spectrum of each of the YAG:Ce-type phosphors of Examples 17 and 18.

FIG. 19 shows, all together, the emission spectrum 24p and the excitation spectrum 25p of the YAG:Ce-type phosphor of Example 17, the emission spectrum 24q and the excitation spectrum 25q of the YAG:Ce-type phosphor of Example 18, and the emission spectrum 24e and the excitation spectrum 25e of Comparative Example shown in Table 1.

Regarding the data shown in FIG. 19, the excitation wavelength used in measuring each emission spectrum and the monitor wavelength used in measuring each excitation spectrum are defined as 440 nm and 540 nm, respectively. Further, the peak of each emission spectrum and that of each excitation spectrum shown in FIG. 19 are defined as 100.

As shown in FIG. 19, while the emission spectrum 24e and the excitation spectrum 25e of the YAG:Ce-type phosphor of Comparative Example (after the reduction treatment) peaked at 565 nm and 450 nm, respectively, the emission spectrum 24p and the excitation spectrum 25p of the YAG:Ce-type phosphor of Example 17 peaked at 561 nm and 457 nm, respectively, and the emission spectrum 24q and the excitation spectrum 25q of the YAG:Ce-type phosphor of Example 18 peaked at 557 nm and 458 nm, respectively.

This suggests not only that the YAG:Ce-type phosphors of Examples 17 and 18 were YAG:Ce-type phosphors that were excited by blue light and emitted a green emission component with a good hue but also that the peak of the emission spectrum and that of the excitation spectrum could be shifted toward the short wavelength side by partially replacing a combination of Y and Al of a conventional YAG:Ce-type phosphor with a combination of Zr and alkaline earth metal element other than Ca, namely Mg or Sr.

From the above, it was determined that even if Mg or Sr was used in placed of Ca, the YAG:Ce-type phosphor of the present invention could produce the same effects as those produced by the phosphor of the present invention using Ca.

Examples 19, 20

For rare earth aluminum garnet type phosphors of Examples 19 and 20, rare earth aluminum garnet type Ce phosphors as compounds obtained by replacing all (Example 19) or half (Example 20) of Y of Example 6 (in which $Ce^{3+}$ was used as a luminescent center) with La were prepared. That is, compounds represented by the composition formula $0.98(Ln_{3-x}Ca_xAl_{5-x}Zr_xO_{12})\cdot0.02Ce_3Al_5O_{12}$ (where Ln is La or $Y_{0.5}La_{0.5}$), in other words, a composition represented by the chemical formula $(La_{(1-y)(1-x/3)}Ca_{(1-y)x/3}Ce_y)_3(Al_{1-(1-y)x/5}Zr_{(1-y)x/5})_5O_{12}$ and a composition represented by the chemical formula $((Y_{0.5}La_{0.5})_{(1-y)(1-x/3)}Ca_{(1-y)x/3}Ce_y)_3(Al_{1-(1-y)x/5}Zr_{(1-y)x/5})_5O_{12}$ (where x=2, and y=0.02) were prepared.

To obtain a compound with the stoichiometric composition $(La_{0.98x2.5/3}Ca_{0.98x0.5/3}Ce_{0.02})_3(Al_{1-0.98x0.5/5}Zr_{0.98x0.5/5})_5O_{12}$ and a composition with the stoichiometric composition $((Y_{0.5}La_{0.5})_{0.98x2.5/3}Ca_{0.98x0.5/3}Ce_{0.02})_3(Al_{1-0.98x0.5/5}Zr_{0.98x0.5/5})_5O_{12}$ by solid phase reaction as in Examples 7 to 11, each raw material was balanced, and a trace amount of reaction accelerator further was used.

Specific proportions of the weighted raw materials and reaction accelerator used in Examples 19 and 20 were set as shown in Table 8.

TABLE 8

| | $Y_2O_3$ (g) | $La_2O_3$ (g) | $CeO_2$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 19 | — | 7.983 | 0.516 | 9.809 | 8.126 | 12.076 | 0.063 | 0.035 |
| Ex. 20 | 2.783 | 3.992 | 0.516 | 9.809 | 8.126 | 12.076 | 0.063 | 0.035 |

Samples of Examples 19 and 20 were prepared in a similar manner as in Examples 7 to 11.

Thereafter, the crystal structure of each of the rare earth aluminum garnet type Ce phosphors of Examples 19 and 20 was evaluated in a similar manner as in Examples 7 to 11 with the X-ray diffraction apparatus.

Figure 20:
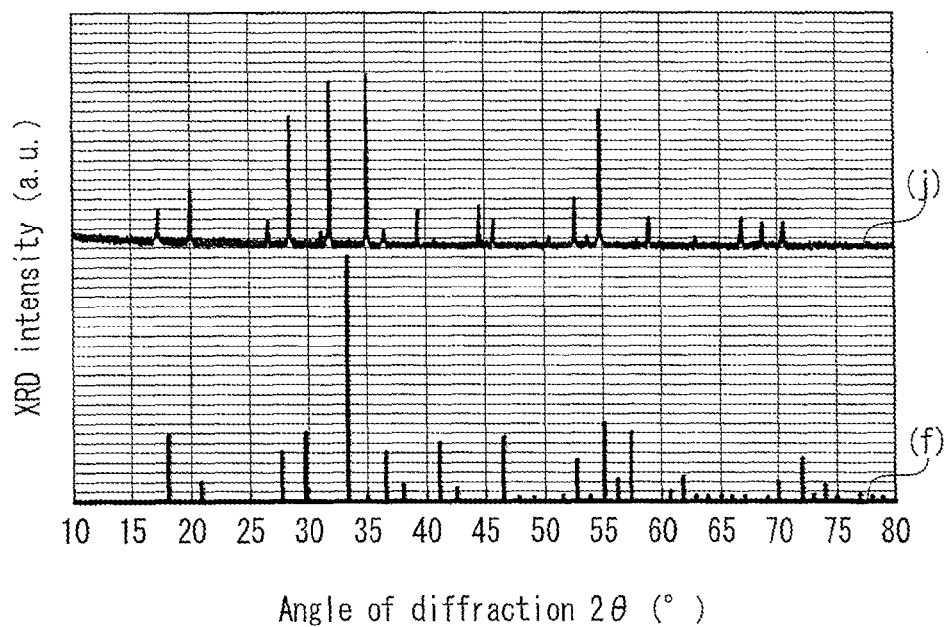
FIG. 20 is a graph showing an XRD pattern of each of LaAG:Ce-type phosphors of Examples 19 and 20.

In FIG. 20, (j) indicates the XRD pattern of Example 19. For reference, the pattern of $Al_5Y_3O_{12}$ (PDF No. 33-0040) as Conventional Example 2 is indicated by (f). Since the XRD pattern of Example 20 was similar to the pattern of Example 19, it is not shown in the graph.

A comparison of the XRD patterns of Examples 19 and 20 (j) and the XRD pattern of Conventional Example 2 (f) in FIG. 20 revealed that the characteristics of the XRD pattern of each of the rare earth aluminum garnet type Ce phosphors of Examples 19 and 20 substantially matched with those of the XRD pattern of $Al_5Y_3O_{12}$ as Comparative Example 2 recorded on PDF in terms of pattern form. This suggests that the rare earth aluminum garnet type Ce phosphors of Examples 19 and 20 had the same garnet structure as that of the compound $Y_3Al_5O_{12}$.

From the above, it was determined that the rare earth aluminum garnet type Ce phosphor of Example 19 was the compound $(Le,Ce)Ca_2Zr_2Al_3O_{12}$ having a garnet crystal structure and represented by the chemical formula $(La_{(1-y)(1-x/3)}Ca_{(1-y)x/3}Ce_y)_3(Al_{1-(1-y)x/5}Zr_{(1-y)x/5})_5O_{12}$ and the rare earth aluminum garnet type Ce phosphor of Example 20 was the compound $((Y_{0.5}La_{0.5}),Ce)Ca_2Zr_2Al_3O_{12}$ having a garnet crystal structure and represented by the chemical formula $((Y_{0.5}La_{0.5})_{(1-y)(1-x/3)}Ca_{(1-y)x/3}Ce_y)_3(Al_{1-(1-y)x/5}Zr_{(1-y)x/5})_5O_{12}$. That is, it was found that rare earth aluminum garnet type phosphors could be produced even by partially or entirely replacing Y of Examples 1 to 18 with La.

Figure 21:
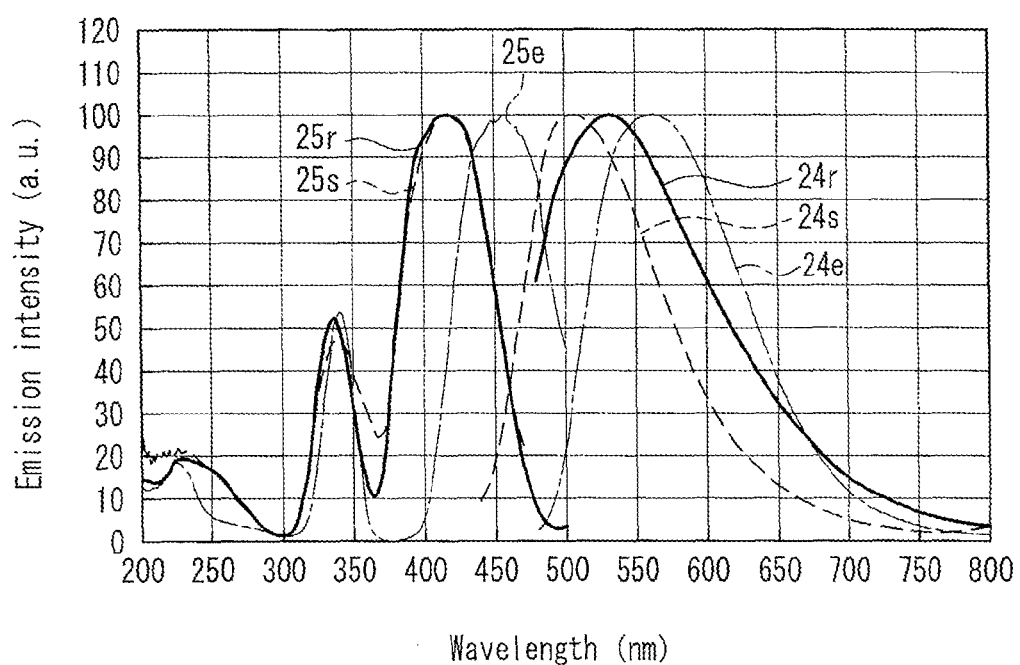
FIG. 21 is a graph showing the excitation spectrum and the emission spectrum of each of the LaAG:Ce-type phosphors of Examples 19 and 20.

The emission spectrum 24 and the excitation spectrum 25 of each of the rare earth aluminum garnet type Ce phosphors of Examples 19 and 20 were evaluated in a similar manner as in Examples 1 to 6. FIG. 21 shows a summary of the results. In FIG. 21, the emission spectrum 24r and the excitation spectrum 25r are data on Example 19, and the emission spectrum 24s and the excitation spectrum 25s are data on Example 20. For comparison, FIG. 21 also shows the emission spectrum 24e and the excitation spectrum 25e as data on a sample obtained by subjecting the conventional YAG:Ce-type phosphor shown in Table 1 as Comparative Example to a reduction treatment.

Regarding the data shown in FIG. 21, the excitation wavelength used in measuring each emission spectrum is defined as the peak excitation wavelength, and the monitor wavelength used in measuring each excitation spectrum is defined as the peak emission wavelength. Further, the peak of each emission spectrum and that of each excitation spectrum shown in FIG. 20 are defined as 100.

As shown in FIG. 21, while the emission spectrum 24e and the excitation spectrum 25e of the conventional YAG:Ce-type phosphor as Comparative Example (after the reduction treatment) peaked at 565 nm and 450 nm, respectively, the emission spectrum 24r and the excitation spectrum 25r of the rare earth aluminum garnet type Ce phosphor of Example 19 peaked at 532 nm and 418 nm, respectively, and the emission spectrum 24s and the excitation spectrum 25s of the rare earth aluminum garnet type Ce phosphor of Example 20 peaked at 509 nm and 415 nm, respectively.

This suggests not only that the rare earth aluminum garnet type Ce phosphors of Examples 19 and 20 were rare earth aluminum garnet type Ce phosphors that were excited by blue light and emitted a blue-green emission component or a green emission component with an excellent hue but also that the peak of the emission spectrum and that of the excitation spectrum could be shifted toward the short wavelength side by partially replacing a combination of Y and Al of a conventional YAG:Ce-type phosphor with a combination of La, Ca and Zr.

From the above, it was determined that even if La was used in placed of Y, the rare earth aluminum garnet type Ce phosphor of the present invention could produce the same effects as those produced by a YAG:Ce-type phosphor using Y.

Examples 21, 22

For a rare earth aluminum garnet type phosphor of Example 21, a rare earth aluminum garnet type Ce phosphor as a compound co-activated with $Ce^{3+}$ and $Tb^{3+}$ and represented by the chemical formula $(Ln_{1-y-z}Ce_yTb_{z1})_3Ca_xAl_{5-x}Zr_xO_{12}$ (where Ln is Y, x=2, and Y=z1=0.05) was prepared.

Further, as a rare earth aluminum garnet type phosphor of Example 22, a rare earth aluminum garnet type Ce phosphor as a compound co-activated with $Ce^{3+}$ and $Mn^{2+}$ and represented by the chemical formula $(Ln_{1-y}Ce_y)_{3-x}(Ca_{1-a}Mn_{z2})_xAl_{5-x}Zr_xO_{12}$ (where Ln is Y, x=2, Y=0.06, and z2=0.05) was prepared.

To obtain a compound with the stoichiometric composition $(Y_{0.90}Ce_{0.05}Tb_{0.05})Ca_2Al_3Zr_2O_{12}$ and a compound with the stoichiometric composition $(Y_{0.94}Ce_{0.06})(Ca_{0.95}Mn_{0.05})_2Al_3Zr_2O_{12}$ by solid phase reaction as in Examples 7 to 11, each raw material was balanced, and a trace amount of reaction accelerator further was used.

Specific proportions of the weighted raw materials and reaction accelerator used in Examples 21 and 22 were set as shown in Tables 9 and 10, respectively.

TABLE 9

| | $Y_2O_3$ (g) | $CeO_2$ (g) | $Tb_4O_7$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 21 | 5.111 | 0.430 | 0.467 | 10.009 | 8.019 | 12.322 | 0.063 | 0.035 |

TABLE 10

| | $Y_2O_3$ (g) | $CeO_2$ (g) | $MnCO_3$ (g) | $CaCO_3$ (g) | $Al_2O_3$ (g) | $ZrO_2$ (g) | $AlF_3$ (g) | $K_2CO_3$ (g) |
|---|---|---|---|---|---|---|---|---|
| Ex. 22 | 5.338 | 0.516 | 0.575 | 9.508 | 8.019 | 12.322 | 0.063 | 0.035 |

Samples of Examples 21 and 22 were prepared in a similar manner as in Examples 7 to 11.

While the XRD pattern of each of the YAG:Ce-type phosphors of Examples 21 and 22 is not shown because it was similar to the pattern of the phosphor of Example 6 indicated by (a) in FIG. 8, it was determined that the YAG:Ce-type phosphor of Example 21 was the compound $(Y,Ca,Ce,Tb)_3(Al,Zr)_5O_{12}$ having a garnet crystal structure and the YAG:

Ce-type phosphor of Example 22 was the compound (Y,Ca,Ce,Mn)$_3$(Al,Zr)$_5$O$_{12}$ having a garnet crystal structure.

Figure 22:
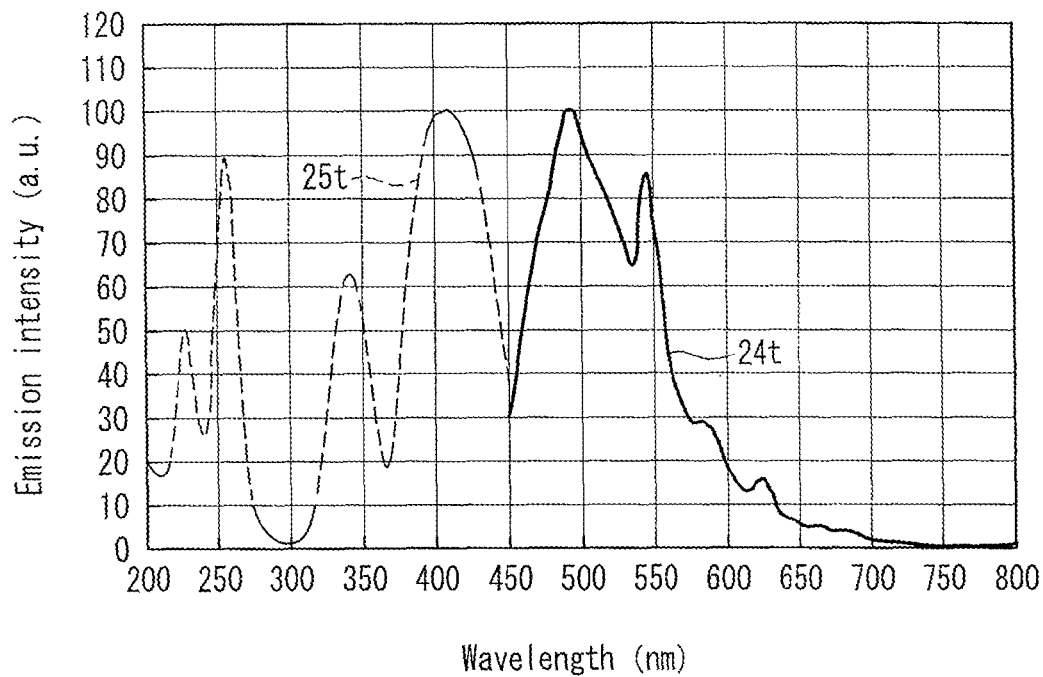
FIG. 22 is a graph showing the excitation spectrum and the emission spectrum of a rare earth aluminum garnet type Ce phosphor of Example 21.

The emission spectrum 24 and the excitation spectrum 25 of each of the rare earth aluminum garnet type Ce phosphors of Examples 21 and 22 were evaluated in a similar manner as in Examples 1 to 6. FIG. 22 shows a summary of the results of Example 21 and FIG. 23 shows a summary of the results of Example 22.

Figure 23:
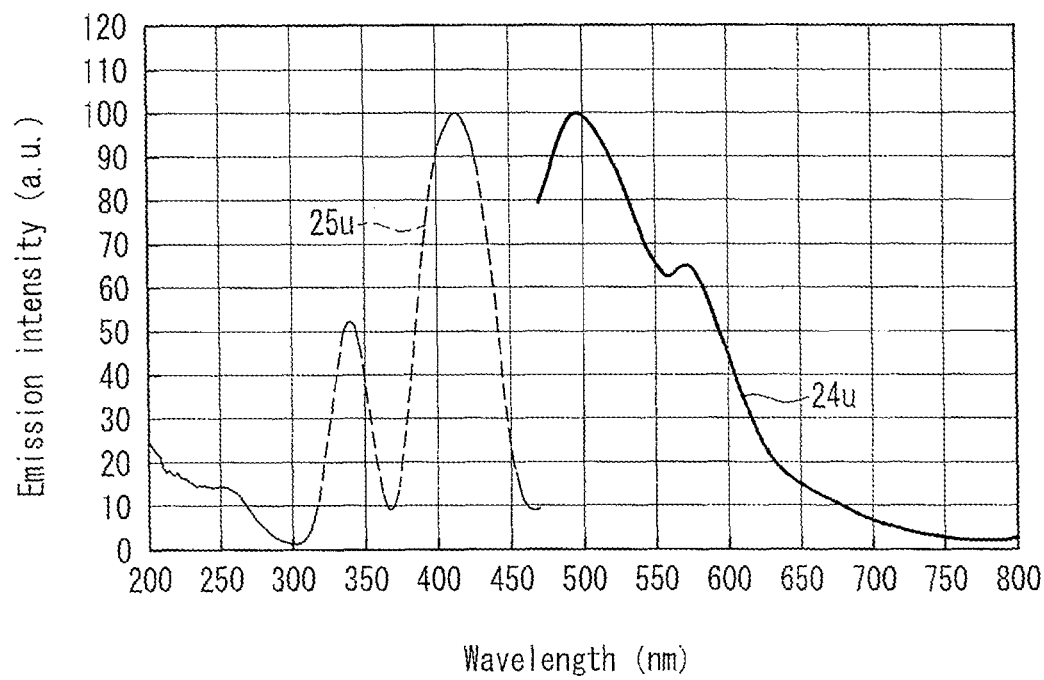
FIG. 23 is a graph showing the excitation spectrum and the emission spectrum of a rare earth aluminum garnet type Ce phosphor of Example 22.

Regarding the data shown in FIGS. 22 and 23, the excitation wavelength used in measuring each emission spectrum is defined as the peak excitation wavelength, and the monitor wavelength used in measuring each excitation spectrum is defined as the peak emission wavelength. Further, the peak of each emission spectrum and that of each excitation spectrum shown in FIGS. 22 and 23 are defined as 100.

As shown in FIG. 22, the emission spectrum 24$t$ of the rare earth aluminum garnet type Ce phosphor of Example 21 had peak components at least at four points: around 495 nm, 546 nm, 585 nm and 625 nm. The excitation spectrum 25$t$ peaked at 410 nm.

From information described in documents and the like, it can be said that the peak at 495 nm was resulting from a combination of the emission based on an electronic energy transition of Ce$^{3+}$ from 5d$^1$ to 4f$^1$ and the emission based on an electronic energy transition of 4f$^8$ electron of Tb$^{3+}$ from $^5D_4$ to $^7F_6$, and the peak around 546 nm was resulting from the emission based on an electronic energy transition of 4f$^8$ electron of Tb$^{3+}$ from $^5D_4$ to $^7F_5$, the peak around 585 nm was resulting from the emission based on an electronic energy transition of 4f$^8$ electron of Tb$^{3+}$ from $^5D_4$ to $^7F_4$, and the peak around 625 nm was resulting from the emission based on an electronic energy transition of 4f$^8$ electron of Tb$^{3+}$ from $^5D_4$ to $^7F_3$.

Further, as shown in FIG. 23, the emission spectrum 24$u$ of the rare earth aluminum garnet type Ce phosphor of Example 22 had peak components at least at two points: around 497 nm and 572 nm. The excitation spectrum 25$u$ peaked at 412 nm.

From information described in documents and the like, it can be said that the peak at 497 nm was resulting from the emission based on an electronic energy transition of Ce$^{3+}$ from 5d$^1$ to 4f$^1$, and the peak around 572 nm was resulting from the emission based on an electron energy transition of 3d$^5$ of Mn$^{2+}$.

These facts suggest not only that the rare earth aluminum garnet type Ce phosphor of Example 21 was a phosphor co-activated with Ce$^{3+}$ and Tb$^{3+}$ and the rare earth aluminum garnet type Ce phosphor of Example 22 was a phosphor co-activated with Ce$^{3+}$ and Mn$^{2+}$ but also that they were rare earth aluminum garnet type Ce phosphors that were excited by purple light or blue light and emitted blue-green and green (and orange and red) emission components and blue-green and yellow emission components, respectively.

From the above, it was determined that the rare earth aluminum garnet type Ce phosphor of the present invention could be embodied not only as a YAG:Ce-type phosphor co-activated with Ce$^{3+}$ and Pr$^{3+}$ as in Example 12 but also as several types of co-activated phosphors including a phosphor co-activated with Ce$^{3+}$ and Tb$^{3+}$ or Ce$^{3+}$ and Mn$^{2+}$.

By changing the ratio between Ce$^{3+}$ and the co-activator (such as Tb$^{3+}$ or Mn$^{2+}$), the ratio between the emission intensity of Ce$^{3+}$ and that of the co-activator can be changed, so that the hue of the emission can be changed. Such a property can be particularly effective in improving the characteristics of white LED illumination light sources.

Examples 23 to 25

For a rare earth aluminum garnet type phosphor of Example 23, a rare earth aluminum garnet type Ce phosphor as a compound activated with Ce$^{3+}$ and represented by the chemical formula (Ln$_{1-y-z}$Ce$_y$)$_{3-x}$Ca$_x$Al$_{5-x}$Zr$_x$O$_{12}$ (where Ln is Lu, x 2, and Y=0.06) was prepared.

Further, for a rare earth aluminum garnet type phosphor of Example 24, a rare earth aluminum garnet type Ce phosphor as a compound activated with Ce$^{3+}$ and represented by the chemical formula (Ln$_{1-y}$Ce$_y$)$_{3-x}$Ca$_x$(Al$_{1-z}$Ga$_z$)$_{5-x}$Zr$_x$O$_{12}$ (where Ln is Y, x=1, y=0.03, and z=0.25) was prepared.

Furthermore, for a rare earth aluminum garnet type phosphor of Example 25, a rare earth aluminum garnet type Ce phosphor as a compound activated with Ce$^{3+}$ and represented by the chemical formula (Ln$_{1-y}$Ce$_y$)$_{3-x}$Ca$_x$(Al$_{1-z}$Sc$_z$)$_{5-x}$Zr$_x$O$_{12}$ (where Ln is Y, x=1, y=0.03, and z=0.25) was prepared.

To obtain a compound with the stoichiometric composition (Lu$_{0.94}$Ce$_{0.06}$)Ca$_2$Al$_3$Zr$_2$O$_{12}$, a compound with the stoichiometric composition (Y$_{0.97}$Ce$_{0.03}$)$_2$CaAl$_3$GaZrO$_{12}$ and a compound with the stoichiometric composition (Y$_{0.97}$Ce$_{0.03}$)$_2$CaAl$_3$ScZrO$_{12}$ by solid phase reaction as in Examples 7 to 11, each raw material was balanced, and a trace amount of reaction accelerator further was used.

Specific proportions of the weighted raw materials and reaction accelerator used in Examples 23, 24, and 25 were set as shown in Tables 11, 12, and 13, respectively.

TABLE 11

| | Lu$_2$O$_3$ (g) | CeO$_2$ (g) | CaCO$_3$ (g) | Al$_2$O$_3$ (g) | ZrO$_2$ (g) | AlF$_3$ (g) | K$_2$CO$_3$ (g) |
|---|---|---|---|---|---|---|---|
| Ex. 23 | 9.352 | 0.516 | 10.009 | 8.019 | 12.322 | 0.063 | 0.035 |

TABLE 12

| | Y$_2$O$_3$ (g) | CeO$_2$ (g) | CaCO$_3$ (g) | Al$_2$O$_3$ (g) | Ga$_2$O$_3$ (g) | ZrO$_2$ (g) | AlF$_3$ (g) | K$_2$CO$_3$ (g) |
|---|---|---|---|---|---|---|---|---|
| Ex. 24 | 11.018 | 0.516 | 5.004 | 8.019 | 4.686 | 6.161 | 0.063 | 0.035 |

TABLE 13

| | Y$_2$O$_3$ (g) | CeO$_2$ (g) | CaCO$_3$ (g) | Al$_2$O$_3$ (g) | Sc$_2$O$_3$ (g) | ZrO$_2$ (g) | AlF$_3$ (g) | K$_2$CO$_3$ (g) |
|---|---|---|---|---|---|---|---|---|
| Ex. 25 | 11.018 | 0.516 | 5.004 | 8.019 | 3.448 | 6.161 | 0.063 | 0.035 |

Samples of Examples 23 to 25 were prepared in a similar manner as in Examples 7 to 11.

Figure 24:
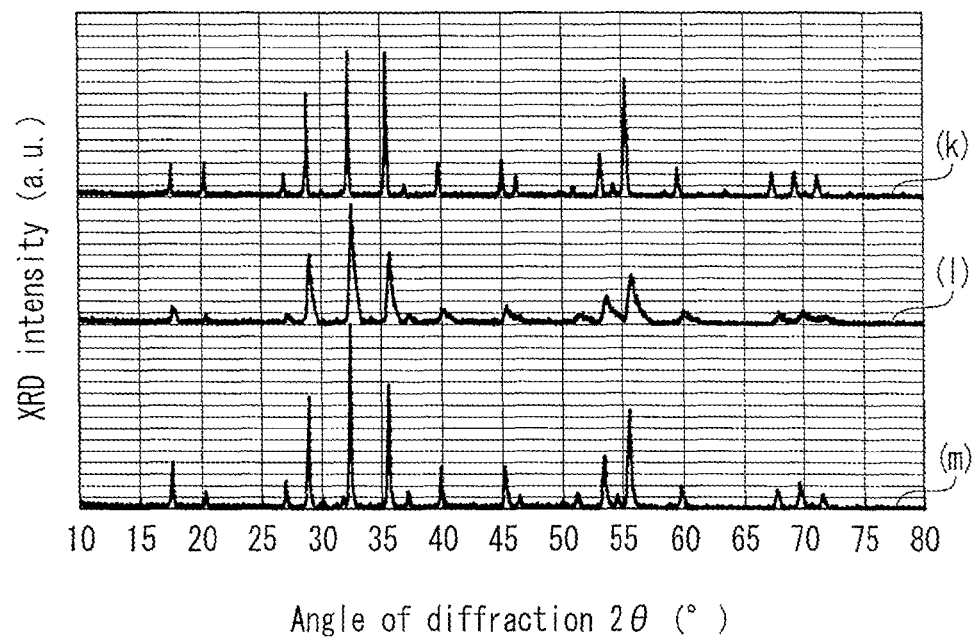
FIG. 24 is a graph showing an XRD pattern of each of rare earth aluminum garnet type Ce phosphors of Examples 23 to 25.

FIG. 24 shows, all together, the XRD pattern of each of the LuAG:Ce-type phosphor of Examples 23 and the YAG:Ce-type phosphors of Examples 24 and 25.

In FIG. 24, (k) indicates the XRD pattern of Example 23, (l) indicates the XRD pattern of Example 24, and (m) indicates the XRD pattern of Example 25.

Each of the XRD patterns indicated by (k) to (m) respectively in FIG. 24 was similar to the XRD pattern of Example 6 indicated by (a) in FIG. 8.

This suggests that the LuAG:Ce-type phosphor of Example 23 and the YAG:Ce-type phosphors of Examples 24 to 25 were compounds having the same garnet crystal structure as that of the YAG:Ce-type phosphor of Example 6.

Further, from comparisons of the XRD pattern of Example 24 indicated by (l) and the XRD pattern of Example 25 indicated by (m) in FIG. 24 and the XRD pattern of Example 4 indicated by (c) in FIG. 8, it was found that the formation of a mixture of two compounds having a garnet structure suggested in Example 4 was eased by partially replacing $Al^{3+}$ of the phosphor with a trivalent ion of larger ion radius than $Al^{3+}$ e.g., at least one ion selected from $Ga^{3+}$ and $Sc^{3+}$) and the phosphor became a compound with a single crystal phase having a garnet crystal structure.

From the above, it was determined that the LuAG:Ce-type phosphor of Examples 23 was the compound $(Lu,Ca,Ce)_3(Al,Zr)_5O_{12}$, and the YAG:Ce-type phosphors of Examples 24 and 25 were the compounds $(Y,Ca,Ce)_3(Al,Ga,Zr)_5O_{12}$ and $(Y,Ca,Ce)_3(Al,Sc,Zr)_5O_{12}$, respectively.

Figure 25:
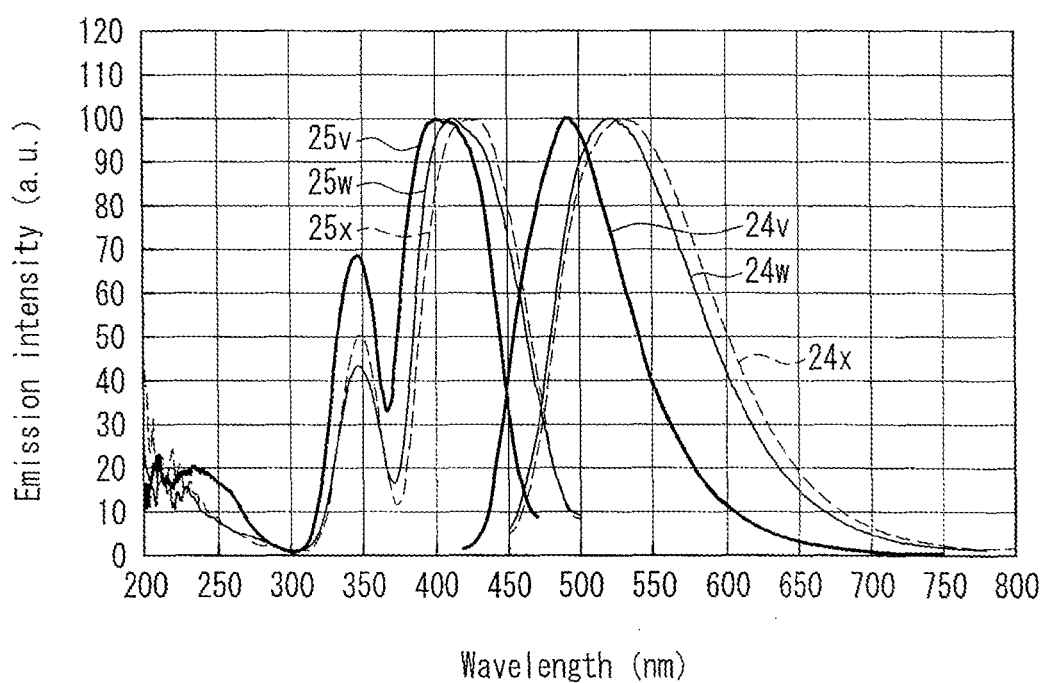
FIG. 25 is a graph showing the excitation spectrum and the emission spectrum of each of the rare earth aluminum garnet type Ce phosphors of Examples 23 to 25.

The emission spectrum 24 and the excitation spectrum 25 of each of the rare earth aluminum garnet type Ce phosphors of Examples 23 to 25 were evaluated in a similar manner as in Examples 1 to 6. FIG. 25 shows all of the results. In FIG. 25, the emission spectrum 24$v$ and the excitation spectrum 25$v$ are data on Example 23, the emission spectrum 24$w$ and the excitation spectrum 25$w$ are data on Example 24, and the emission spectrum 24$x$ and the excitation spectrum 25$x$ are data on Example 25.

Regarding the data shown in FIG. 25, the excitation wavelength used in measuring each emission spectrum is defined as the peak excitation wavelength, and the monitor wavelength used in measuring each excitation spectrum is defined as the peak emission wavelength. Further, the peak of each emission spectrum and that of each excitation spectrum shown in FIG. 25 are defined as 100.

As shown in FIG. 25, the emission spectrum 24$v$ of the rare earth aluminum garnet type Ce phosphor of Example 23 had a peak component around 490 nm and the excitation spectrum 25$v$ peaked at 400 nm. Further, the emission spectrum 24$w$ of the rare earth aluminum garnet type Ce phosphor of Example 24 had a peak component around 520 nm and the excitation spectrum 25$w$ peaked at 410 nm. Furthermore, the emission spectrum 24$x$ of the rare earth aluminum garnet type Ce phosphor of Example 25 had a peak component around 530 nm and the excitation spectrum 25$x$ peaked at 425 nm.

From information described in documents and the like, all of the peaks were resulting from the emission based on an electronic energy transition of $Ce^{3+}$ from $5d^1$ to $4f^1$.

These facts suggest not only that the rare earth aluminum garnet type Ce phosphors of Examples 23 to 25 were phosphors activated with $Ce^{3+}$ but also were rare earth aluminum garnet type Ce phosphors that were excited by purple or blue light and emitted green-blue to green emission components.

From Examples 1 to 25 described above, it is clear that the rare earth aluminum garnet type phosphor of the present invention can be modified in terms of composition and types of luminescent center to take a variety of forms including, in particular, a solid solution of garnet compounds.

The present invention is not limited to Examples described above as long as the rare earth aluminum garnet type phosphor includes a compound including a fluorescent ion and having a garnet structure including a rare earth element, aluminum, and oxygen, and the compound has such a composition that a combination of the rare earth element and the aluminum of the compound is partially replaced with a combination of alkaline earth metal and zirconium (Zr) or alkaline earth metal and hafnium (Hf).

INDUSTRIAL APPLICABILITY

As described above, according to the present invention, it is possible to provide a new phosphor capable of emitting light having a wide range of wavelengths without heavily using rare and expensive raw materials in forming the composition. Further, by using this phosphor, a variety of light-emitting devices having improved color rendering and allowing a reduction in production cost can be achieved. Thus, the present invention is useful in applications such as illumination light sources and light-emitting light sources and electronic devices using these light sources.

The invention claimed is:

1. A rare earth aluminum garnet phosphor, comprising a compound that comprises a rare earth element, aluminum, and oxygen, which form a garnet structure, and a fluorescent ion,
   wherein the compound has the garnet structure in which a combination of the rare earth element and the aluminum is partially replaced with a combination of an alkaline earth metal and zirconium (Zr) or a combination of an alkaline earth metal and hafnium (Hf), so that both the rare earth element and the aluminum in the garnet structure are replaced.

2. The rare earth aluminum garnet phosphor according to claim 1,
   wherein the rare earth element is at least one element selected from the group consisting of yttrium, lanthanum, and lutetium, and
   the compound belongs to at least one compound group selected from the group consisting of a yttrium aluminum garnet compound group, a lanthanum aluminum garnet compound group, or a lutetium aluminum garnet compound group.

3. The rare earth aluminum garnet phosphor according to claim 1, wherein a total number of atoms of the partially replacing alkaline earth metal is greater than 0.1 and smaller than or equal to 2.0 relative to 12 anions constituting the compound having the garnet structure.

4. The rare earth aluminum garnet phosphor according to claim 1, wherein a number of atoms of the rare earth element in the garnet structure is greater than or equal to 1 and less than 2 relative to 12 anions constituting the compound having the garnet structure.

5. The rare earth aluminum garnet phosphor according to claim 2, wherein the compound is a compound including the fluorescent ion and the garnet structure represented by a chemical formula $Ln_{3-x}M_xAl_{5-x}X_xO_{12}$, where Ln is the rare earth element including at least one element selected from the group consisting of the yttrium (Y), the lanthanum (La), and the lutetium (Lu), M is the alkaline earth metal, X is at least one transition metal selected from the group consisting of the zirconium (Zr) and the hafnium (Hf), and x satisfies $0<x\leq2$.

6. The rare earth aluminum garnet phosphor according to claim 1, wherein the alkaline earth metal comprises at least calcium (Ca).

7. The rare earth aluminum garnet phosphor according to claim 5, wherein x is equal to 2.

8. The rare earth aluminum garnet phosphor according to claim 5, wherein the compound is represented by any one of chemical formulas $Y_{3-x}Ca_xAl_{5-x}Zr_xO_{12}$, $Y_{3-x}Ca_xAl_{5-x}Hf_xO_{12}$, $La_{3-x}Ca_xAl_{5-x}Zr_xO_{12}$, and $Lu_{3-x}Ca_xAl_{5-x}Zr_xO_{12}$, where x satisfies $0<x\leq2$.

9. The rare earth aluminum garnet phosphor according to claim 1, wherein the fluorescent ion comprises $Ce^{3+}$.

10. The rare earth aluminum garnet phosphor according to claim 9, wherein the fluorescent ion further comprises at least one ion selected from the group consisting of $Pr^{3+}$, $Tb^{3+}$, and $Mn^{2+}$.

11. The rare earth aluminum garnet phosphor according to claim 1, wherein the rare earth aluminum garnet phosphor includes no artificially added Ga, Lu, or Sc.

12. A light-emitting device comprising a phosphor and a light source for generating primary light with which the phosphor is irradiated,
   wherein the rare earth aluminum garnet phosphor according to claim 1 is used as the phosphor, and
   the light-emitting device converts the primary light into light having a longer wavelength than an original wavelength of the primary light and emits the longer wavelength light.

13. The light-emitting device according to claim 12,
   wherein a semiconductor solid-state light-emitting element having an emission peak in a wavelength range of 400 nm to 480 nm is used as a light source for generating the primary light, and
   the light emitted by the light-emitting device has an emission peak in a range of 485 nm or longer.

14. The light-emitting device according to claim 13, wherein the light emitted by the light-emitting device has an emission peak in a range from 485 nm to shorter than 540 nm.

15. The rare earth aluminum garnet phosphor according to claim 1, wherein the compound has the garnet structure in which the combination of the rare earth element and the aluminum is partially replaced with the combination of the alkaline earth metal and zirconium (Zr) or the combination of the alkaline earth metal and hafnium (Hf), so that a replaced amount by an atom number of the rare earth element is same as a replaced amount by an atom number of the aluminum in the garnet structure.

* * * * *